United States Patent
Zanbaghi

(10) Patent No.: US 9,603,206 B2
(45) Date of Patent: Mar. 21, 2017

(54) DETECTION AND CONTROL MECHANISM FOR TAIL CURRENT IN A BIPOLAR JUNCTION TRANSISTOR (BJT)-BASED POWER STAGE

(71) Applicant: Cirrus Logic, Inc., Austin, TX (US)

(72) Inventor: Ramin Zanbaghi, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 14/696,212

(22) Filed: Apr. 24, 2015

(65) Prior Publication Data

US 2016/0255686 A1 Sep. 1, 2016

Related U.S. Application Data

(63) Continuation-in-part of application No. 14/634,716, filed on Feb. 27, 2015.

(51) Int. Cl.
| | | |
|---|---|---|
| *H05B 33/08* | (2006.01) | |
| *H03K 17/60* | (2006.01) | |
| *H02M 1/00* | (2006.01) | |

(52) U.S. Cl.
CPC .......... *H05B 33/0815* (2013.01); *H02M 1/00* (2013.01); *H03K 17/602* (2013.01); *H05B 33/0845* (2013.01)

(58) Field of Classification Search
CPC  H05B 33/08; H05B 33/0845; H05B 33/0815; H02M 1/00; H03K 17/60; H03K 17/602

(Continued)

(56) References Cited

U.S. PATENT DOCUMENTS

| | | |
|---|---|---|
| 3,660,751 A | 5/1972 | Bullinga |
| 3,790,878 A | 2/1974 | Brokaw |

(Continued)

FOREIGN PATENT DOCUMENTS

| | | |
|---|---|---|
| EP | 0536535 A1 | 4/1993 |
| EP | 0636889 A1 | 2/1995 |

(Continued)

OTHER PUBLICATIONS

Supertex, Inc., HV9931 Unity Power Factor LED Lamp Driver, Supertex, Inc., Application Note AN-H52, 2007, pp. 1-20, Sunnyvale, CA, USA.

(Continued)

*Primary Examiner* — Thai Pham
(74) *Attorney, Agent, or Firm* — Norton Rose Fulbright US LLP

(57) ABSTRACT

A bipolar junction transistor (BJT) may be used in a power stage DC-to-DC converter, such as a converter in LED-based light bulbs. A closed-loop control system may be implemented with the power stage to monitor a tail current of the BJT. The closed-loop control system may include a first comparator for monitoring a base voltage while a pull-down current source is coupled to the base of the BJT. Additionally, a second comparator may be included for monitoring the base voltage after the pull-down current source is decoupled from the base of the BJT. The delay time for turning off the BJT may be determined by monitoring output from the first and second comparators. The forward base current applied to the base of the BJT may be adjusted based on the determined delay time to reduce the delay time and thus reduce excess power dissipation by the BJT.

20 Claims, 11 Drawing Sheets

(58) Field of Classification Search
USPC ... 315/209 R, 224, 225, 291, 294, 297, 307, 315/308; 363/21.03, 21.04, 21.12, 21.13, 363/21.17, 97
See application file for complete search history.

(56) References Cited

U.S. PATENT DOCUMENTS

| | | |
|---|---|---|
| 4,322,785 A | 3/1982 | Walker |
| 4,339,671 A | 7/1982 | Park et al. |
| 4,342,956 A | 8/1982 | Archer |
| 4,399,500 A | 8/1983 | Clarke et al. |
| 4,410,810 A | 10/1983 | Christen |
| 4,493,017 A | 1/1985 | Kammiller et al. |
| 4,585,986 A | 4/1986 | Dyer |
| 4,629,971 A | 12/1986 | Kirk |
| 4,675,547 A | 6/1987 | Eichenwald |
| 4,677,366 A | 6/1987 | Wilkinson et al. |
| 4,683,529 A | 7/1987 | Bucher, II |
| 4,737,658 A | 4/1988 | Kronmuller et al. |
| 4,739,462 A | 4/1988 | Farnsworth et al. |
| 4,937,728 A | 6/1990 | Leonardi |
| 4,940,929 A | 7/1990 | Williams |
| 4,970,635 A | 11/1990 | Shekhawat et al. |
| 4,977,366 A | 12/1990 | Powell |
| 5,001,620 A | 3/1991 | Smith |
| 5,003,454 A | 3/1991 | Bruning |
| 5,055,746 A | 10/1991 | Hu et al. |
| 5,109,185 A | 4/1992 | Ball |
| 5,173,643 A | 12/1992 | Sullivan et al. |
| 5,264,780 A | 11/1993 | Bruer et al. |
| 5,278,490 A | 1/1994 | Smedley |
| 5,383,109 A | 1/1995 | Maksimovic et al. |
| 5,424,665 A | 6/1995 | Sueri et al. |
| 5,424,932 A | 6/1995 | Inou et al. |
| 5,430,635 A | 7/1995 | Liu |
| 5,479,333 A | 12/1995 | McCambridge et al. |
| 5,481,178 A | 1/1996 | Wilcox et al. |
| 5,486,781 A | 1/1996 | Im |
| 5,565,761 A | 10/1996 | Hwang |
| 5,638,265 A | 6/1997 | Gabor |
| 5,691,890 A | 11/1997 | Hyde |
| 5,747,977 A | 5/1998 | Hwang |
| 5,757,635 A | 5/1998 | Seong |
| 5,764,039 A | 6/1998 | Choi et al. |
| 5,783,909 A | 7/1998 | Hochstein |
| 5,798,635 A | 8/1998 | Hwang et al. |
| 5,808,453 A | 9/1998 | Lee et al. |
| 5,874,725 A | 2/1999 | Yamaguchi |
| 5,960,207 A | 9/1999 | Brown |
| 5,994,885 A | 11/1999 | Wilcox et al. |
| 6,043,633 A | 3/2000 | Lev et al. |
| 6,084,450 A | 7/2000 | Smith et al. |
| 6,091,233 A | 7/2000 | Hwang et al. |
| 6,160,724 A | 12/2000 | Hemena et al. |
| 6,229,292 B1 | 5/2001 | Redl et al. |
| 6,259,614 B1 | 7/2001 | Ribarich et al. |
| 6,300,723 B1 | 10/2001 | Wang et al. |
| 6,304,066 B1 | 10/2001 | Wilcox et al. |
| 6,304,473 B1 | 10/2001 | Telefus et al. |
| 6,343,026 B1 | 1/2002 | Perry |
| 6,356,040 B1 | 3/2002 | Preis et al. |
| 6,445,600 B2 | 9/2002 | Ben-Yaakov |
| 6,469,484 B2 | 10/2002 | L'Hermite et al. |
| 6,510,995 B2 | 1/2003 | Muthu et al. |
| 6,531,854 B2 | 3/2003 | Hwang |
| 6,580,258 B2 | 6/2003 | Wilcox et al. |
| 6,583,550 B2 | 6/2003 | Iwasa et al. |
| 6,628,106 B1 | 9/2003 | Batarseh et al. |
| 6,657,417 B1 | 12/2003 | Hwang |
| 6,661,182 B2 | 12/2003 | Sridharan |
| 6,696,803 B2 | 2/2004 | Tao et al. |
| 6,724,174 B1 | 4/2004 | Esteves et al. |
| 6,758,199 B2 | 7/2004 | Masters et al. |
| 6,768,655 B1 | 7/2004 | Yang et al. |
| 6,781,351 B2 | 8/2004 | Mednik et al. |
| 6,839,247 B1 | 1/2005 | Yang et al. |
| 6,882,552 B2 | 4/2005 | Telefus et al. |
| 6,894,471 B2 | 5/2005 | Corva et al. |
| 6,933,706 B2 | 8/2005 | Shih |
| 6,940,733 B2 | 9/2005 | Schie et al. |
| 6,944,034 B1 | 9/2005 | Shteynberg et al. |
| 6,956,750 B1 | 10/2005 | Eason et al. |
| 6,975,523 B2 | 12/2005 | Kim et al. |
| 6,980,446 B2 | 12/2005 | Simada et al. |
| 7,042,161 B1 | 5/2006 | Konopka |
| 7,072,191 B2 | 7/2006 | Nakao et al. |
| 7,099,163 B1 | 8/2006 | Ying |
| 7,161,816 B2 | 1/2007 | Shteynberg et al. |
| 7,221,130 B2 | 5/2007 | Ribeiro et al. |
| 7,224,206 B2 | 5/2007 | Pappalardo et al. |
| 7,233,135 B2 | 6/2007 | Noma et al. |
| 7,266,001 B1 | 9/2007 | Notohamiprodjo et al. |
| 7,292,013 B1 | 11/2007 | Chen et al. |
| 7,295,452 B1 | 11/2007 | Liu |
| 7,411,379 B2 | 8/2008 | Chu et al. |
| 7,414,371 B1 | 8/2008 | Choi et al. |
| 7,439,810 B2 | 10/2008 | Manicone et al. |
| 7,449,841 B2 | 11/2008 | Ball |
| 7,554,473 B2 | 6/2009 | Melanson |
| 7,567,091 B2 | 7/2009 | Farnworth et al. |
| 7,606,532 B2 | 10/2009 | Wuidart |
| 7,667,986 B2 | 2/2010 | Artusi et al. |
| 7,684,223 B2 | 3/2010 | Wei |
| 7,719,246 B2 | 5/2010 | Melanson |
| 7,719,248 B1 | 5/2010 | Melanson |
| 7,746,043 B2 | 6/2010 | Melanson |
| 7,804,480 B2 | 9/2010 | Jeon et al. |
| 7,834,553 B2 | 11/2010 | Hunt et al. |
| 7,859,488 B2 | 12/2010 | Kimura |
| 7,872,883 B1 | 1/2011 | Elbanhawy |
| 7,894,216 B2 | 2/2011 | Melanson |
| 8,008,898 B2 | 8/2011 | Melanson et al. |
| 8,169,806 B2 | 5/2012 | Sims et al. |
| 8,193,717 B2 | 6/2012 | Leiderman |
| 8,222,772 B1 | 7/2012 | Vinciarelli |
| 8,242,764 B2 | 8/2012 | Shimizu et al. |
| 8,248,145 B2 | 8/2012 | Melanson |
| 8,369,109 B2 | 2/2013 | Niedermeier et al. |
| 8,441,220 B2 | 5/2013 | Imura |
| 8,536,799 B1 | 9/2013 | Grisamore et al. |
| 8,610,364 B2 | 12/2013 | Melanson et al. |
| 8,890,443 B2 * | 11/2014 | Kang .................. G09G 3/3406 315/294 |
| 2002/0082056 A1 | 6/2002 | Mandai et al. |
| 2003/0090252 A1 | 5/2003 | Hazucha |
| 2003/0111969 A1 | 6/2003 | Konishi et al. |
| 2003/0160576 A1 | 8/2003 | Suzuki |
| 2003/0174520 A1 | 9/2003 | Bimbaud |
| 2003/0214821 A1 | 11/2003 | Giannopoulos et al. |
| 2003/0223255 A1 | 12/2003 | Ben-Yaakov et al. |
| 2004/0046683 A1 | 3/2004 | Mitamura et al. |
| 2004/0196672 A1 | 10/2004 | Amei |
| 2005/0057237 A1 | 3/2005 | Clavel |
| 2005/0207190 A1 | 9/2005 | Gritter |
| 2005/0231183 A1 | 10/2005 | Li et al. |
| 2005/0270813 A1 | 12/2005 | Zhang et al. |
| 2005/0275354 A1 | 12/2005 | Hausman et al. |
| 2006/0013026 A1 | 1/2006 | Frank et al. |
| 2006/0022648 A1 | 2/2006 | Ben-Yaakov et al. |
| 2006/0214603 A1 | 9/2006 | Oh et al. |
| 2007/0103949 A1 | 5/2007 | Tsuruya |
| 2007/0182347 A1 | 8/2007 | Shteynberg et al. |
| 2008/0018261 A1 | 1/2008 | Kastner |
| 2008/0018267 A1 * | 1/2008 | Arakawa ............ H05B 33/0815 315/301 |
| 2008/0043504 A1 | 2/2008 | Ye et al. |
| 2008/0062584 A1 | 3/2008 | Freitag et al. |
| 2008/0062586 A1 | 3/2008 | Apfel |
| 2008/0117656 A1 | 5/2008 | Clarkin |
| 2008/0130336 A1 | 6/2008 | Taguchi |
| 2008/0175029 A1 | 7/2008 | Jung et al. |
| 2008/0259655 A1 | 10/2008 | Wei et al. |
| 2008/0278132 A1 | 11/2008 | Kesterson et al. |
| 2008/0310194 A1 | 12/2008 | Huang et al. |

(56) References Cited

U.S. PATENT DOCUMENTS

| | | |
|---|---|---|
| 2009/0040796 A1 | 2/2009 | Lalithambika et al. |
| 2009/0059632 A1 | 3/2009 | Li et al. |
| 2009/0067204 A1 | 3/2009 | Ye et al. |
| 2009/0108677 A1 | 4/2009 | Walter et al. |
| 2009/0184665 A1 | 7/2009 | Ferro |
| 2009/0295300 A1 | 12/2009 | King |
| 2010/0128501 A1 | 5/2010 | Huang et al. |
| 2010/0202165 A1 | 8/2010 | Zheng et al. |
| 2010/0238689 A1 | 9/2010 | Fei et al. |
| 2010/0244793 A1 | 9/2010 | Caldwell |
| 2011/0110132 A1 | 5/2011 | Rausch et al. |
| 2011/0199793 A1 | 8/2011 | Kuang et al. |
| 2011/0276938 A1 | 11/2011 | Perry et al. |
| 2011/0291583 A1 | 12/2011 | Shen |
| 2011/0298442 A1 | 12/2011 | Waltisperger et al. |
| 2011/0309760 A1 | 12/2011 | Beland et al. |
| 2012/0062131 A1 | 3/2012 | Choi et al. |
| 2012/0146540 A1 | 6/2012 | Khayat et al. |
| 2012/0182003 A1 | 7/2012 | Flaibani et al. |
| 2012/0187997 A1 | 7/2012 | Liao et al. |
| 2012/0248998 A1 | 10/2012 | Yoshinaga |
| 2012/0286843 A1 | 11/2012 | Kurokawa |
| 2012/0320640 A1 | 12/2012 | Baurle et al. |
| 2013/0088902 A1 | 4/2013 | Dunipace |
| 2013/0107595 A1 | 5/2013 | Gautier et al. |
| 2013/0181635 A1* | 7/2013 | Ling ............... H02M 3/33507 315/297 |
| 2013/0279209 A1* | 10/2013 | Zheng ............ H02M 3/33507 363/21.12 |
| 2014/0218978 A1 | 8/2014 | Heuken et al. |

FOREIGN PATENT DOCUMENTS

| | | |
|---|---|---|
| EP | 1213823 A2 | 6/2002 |
| EP | 1289107 A2 | 3/2003 |
| EP | 1962263 A2 | 8/2008 |
| EP | 2232949 A2 | 9/2010 |
| EP | 2257124 A1 | 12/2010 |
| JP | 2008053181 A | 3/2008 |
| WO | 01/84697 A2 | 11/2001 |
| WO | 2004051834 A1 | 6/2004 |
| WO | 2006013557 A2 | 2/2006 |
| WO | 2006/022107 A1 | 3/2006 |
| WO | 2007016373 A2 | 2/2007 |
| WO | 2008004008 A2 | 1/2008 |
| WO | 2008152838 A1 | 12/2008 |
| WO | 2010011971 A1 | 1/2010 |
| WO | 2010065598 A2 | 6/2010 |
| WO | 2011008635 A1 | 1/2011 |

OTHER PUBLICATIONS

Ben-Yaakov, et al, The Dynamics of a PWM Boost Converter with Resistive Input, IEEE Transactions on Industrial Electronics, vol. 46., No. 3, Jun. 1999, pp. 1-8, Negev, Beer-Sheva, Israel.

Erickson, Robert W., et al, Fundamentals of Power Electronics, Second Edition, Chapter 6, 2001, pp. 131-184, Boulder CO, USA.

STMicroelectronics, CFL/TL Ballast Driver Preheat and Dimming L6574, Sep. 2003, pp. 1-10, Geneva, Switzerland.

Fairchild Semiconductor, 500W Power-Factor-Corrected (PFC) Converter Design with FAN4810, Application Note 6004, Rev. 1.0.1, Oct. 31, 2003, pp. 1-14, San Jose, CA, USA.

Fairfield Semiconductor, Power Factor Correction (PFC) Basics, Application Note 42047, Rev. 0.9.0, Aug. 19, 2004, pp. 1-11, San Jose, CA, USA.

Fairchild Semiconductor, Design of Power Factor Correction Circuit Using FAN7527B, Application Note AN4121, Rev. 1.0.1, May 30, 2002, pp. 1-12, San Jose, CA, USA.

Fairchild Semiconductor, Low Start-Up Current PFC/PWM Controller Combos FAN4800, Rev. 1.0.6, Nov. 2006, pp. 1-20, San Jose, CA, USA.

Prodic, Aleksander, Compensator Design and Stability Assessment for Fast Voltage Loops of Power Factor Correction Rectifiers, IEEE Transactions on Power Electronics, vol. 22, Issue 5, Sep. 2007, pp. 1719-1730, Toronto, Canada.

Fairchild Semiconductor, ZVS Average Current PFC Controller FAN 4822, Rev. 1.0.1, Aug. 10, 2001, pp. 1-10, San Jose, CA, USA.

Prodic, et al, Dead-Zone Digital Controller for Improved Dynamic Response of Power Factor Preregulators, Applied Power Electronics Conference and Exposition, 2003, vol. 1, pp. 382-388, Boulder CA, USA.

Philips Semiconductors, 90W Resonant SMPS with TEA 1610 Swing Chip, Application Note AN99011, Sep. 14, 1999, pp. 1-28, The Netherlands.

Fairchild Semiconductor, Power Factor Correction Controller FAN7527B, Aug. 16, 2003, pp. 1-12, San Jose, CA, USA.

On Semiconductor, Power Factor Controller for Compact and Robust, Continuous Conduction Mode Pre-Converters, NCP1654, Mar. 2007, Rev. PO, pp. 1-10, Denver, CO, USA.

Fairchild Semicondctor, Simple Ballast Controller, KA7541, Rev. 1.0.3, Sep. 27, 2001, pp. 1-14, San Jose, CA, USA.

Fairchild Semiconductor, Power Factor Controller, ML4812, Rev. 1.0.4, May 31, 2001, pp. 1-18, San Jose, CA, USA.

Prodic, et al, Digital Controller for High-Frequency Rectifiers with Power Factor Correction Suitable for on-Chip Implementation, Power Conversion Conference-Nagoya, 2007. PCC '07, Apr. 2-5, 2007, pp. 1527-1531, Toronto, Canada.

Freescale Semiconductor, Dimmable Light Ballast with Power Factor Correction, Designer Reference Manual, DRM067, Rev. 1, Dec. 2005, M68HC08 Microcontrollers, pp. 1-72, Chandler, AZ, USA.

Freescale Semiconductor, Design of Indirect Power Factor Correction Using 56F800/E, Freescale Semiconductor Application Note, AN1965, Rev. 1, Jul. 2005, pp. 1-20, Chandler, AZ, USA.

Freescale Semiconductor, Implementing PFC Average Current Mode Control using the MC9S12E128, Application Note AN3052, Addendum to Reference Design Manual DRM064, Rev. 0, Nov. 2005, pp. 1-8, Chandler, AZ, USA.

Hirota, et al, Analysis of Single Switch Delta-Sigma Modulated Pulse Space Modulation PFC Converter Effectively Using Switching Power Device, Power Electronics Specialists Conference, 2002. pesc 02. 2002 IEEE 33rd Annual, vol. 2, pp. 682-686, Hyogo Japan.

Madigan, et al, Integrated High-Quality Rectifier-Regulators, Industrial Electronics, IEEE Transactions, vol. 46, Issue 4, pp. 749-758, Aug. 1999, Cary, NC, USA.

Renesas, Renesas Technology Releases Industry's First Critical-Conduction-Mode Power Factor Correction Control IC Implementing Interleaved Operations, R2A20112, pp. 1-4, Dec. 18, 2006, Tokyo, Japan.

Renesas, PFC Control IC R2A20111 Evaluation Board, Application Note R2A20111 EVB, all pages, Feb. 2007, Rev. 1.0, pp. 1-39, Tokyo, Japan.

Miwa, et al, High Efficiency Power Factor Correction Using Interleaving Techniques, Applied Power Electronics Conference and Exposition, 1992. APEC '92. Conference Proceedings 1992., Seventh Annual, Feb. 23-27, 1992, pp. 557-568, MIT, Cambridge, MA, USA.

Noon, Jim, High Performance Power Factor Preregulator UC3855A!B, Texas Instruments Application Report, SLUA146A, May 1996—Revised Apr. 2004, pp. 1-35, Dallas TX, USA.

NXP Semiconductors, TEA1750, GreenChip III SMPS Control IC Product Data Sheet, Rev.01, Apr. 6, 2007, pp. 1-29, Eindhoven, The Netherlands.

Turchi, Joel, Power Factor Correction Stages Operating in Critical Conduction Mode, on Semiconductor, Application Note AND8123/ D, Sep. 2003-Rev. 1 , pp. 1-20, Denver, CO, USA.

On Semiconductor, Greenline Compact Power Factor Controller: Innovative Circuit for Cost Effective Solutions, MC33260, Semiconductor Components Industries, Sep. 2005—Rev. 9, pp. 1-22, Denver, CO, USA.

On Semiconductor, Enhanced, High Voltage and Efficient Standby Mode, Power Factor Controller, NCP1605, Feb. 2007, Rev. 1, pp. 1-32, Denver, CO, USA.

(56) References Cited

OTHER PUBLICATIONS

On Semiconductor, Cost Effective Power Factor Controller, NCP1606, Mar. 2007, Rev. 3, pp. 1-22, Denver, CO, USA.
Renesas, Power Factor Correction Controller IC, HA16174P/FP, Rev. 1.0, Jan. 6, 2006, pp. 1-38, Tokyo, Japan.
Seidel, et al, A Practical Comparison Among High-Power-Factor Electronic Ballasts with Similar Ideas, IEEE Transactions on Industry Applications, vol. 41, No. 6, Nov./Dec. 2005, pp. 1574-1583, Santa Maria, Brazil.
STMicroelectronics, Electronic Ballast with PFC using L6574 and L6561. Application Note AN993, May 2004, pp. 1-20, Geneva, Switzerland.
STMicroelectronics, Advanced Transition-Mode PFC Controller L6563 and L6563A, Mar. 2007, pp. 1-40, Geneva, Switzerland.
Su, et al, "Ultra Fast Fixed-Frequency Hysteretic Buck Converter with Maximum Charging Current Control and Adaptive Delay Compensation for DVS Applications", IEEE Journal of Solid-Slate Circuits, vol. 43, No. 4, Apr. 2008, pp. 815-822, Hong Kong University of Science and Technology, Hong Kong, China.
Wong, et al, "Steady State Analysis of Hysteretic Control Buck Converters", 2008 13th International Power Electronics and Motion Control Conference (EPE-PEMC 2008), pp. 400-404, 2008, National Semiconductor Corporation, Power Management Design Center, Hong Kong, China.
Zhao, et al, Steady-State and Dynamic Analysis of a Buck Converter Using a Hysteretic PWM Control, 2004 35th Annual IEEE Power Electronics Specialists Conference, pp. 3654-3658, Department of Electrical & Electronic Engineering, Oita University, 2004, Oita, Japan.
International Search Report, PCT/US2012/069942, European Patent Office, Jul. 21, 2014, pp. 1-5.
Written Opinion, PCT/US2012/069942, European Patent Office, Jul. 21, 2014, pp. 1-8.
International Search Report, PCT/US2014/021921, European Patent Office, Jun. 23, 2014, pp. 1-3.
Written Opinion, PCT/US2014/021921, European Patent Office, Jun. 23, 2014, pp. 1-5.
International Search Report and Written Opinion mailed Sep. 18, 2014, during examination of PCT/US2014/038490, cited references previously disclosed on Sep. 29, 2014.
International Search Report and Written Opinion mailed Sep. 16, 2014, during examination of PCT/US2014/038507, cited references previously disclosed on Sep. 29, 2014.
Severns, A New Improved and Simplified Proportional Base Drive Circuit, Proceedings of PowerCon 6, May 1979.
Ivanovic, Zelimir, "A low consumption proportional base drive circuit design for switching transistors", Proceedings of the Fifth International PCI '82 Conference: Sep. 28-30, 1982, Geneva, Switzerland.
Bell, David, "Designing optimal base drive for high voltage switching transistors", Proceeding of PowerCon7, 1980.
Marcelo Godoy Simões, "Power Bipolar Transistors", Chapter 5, Academic Press 2001, pp. 63-74.
Varga, L.D. and Losic, N.A., "Design of a high-performance floating power BJT driver with proportional base drive," Industry Applications Society Annual Meeting, 1989., Conference Record of the Oct. 1-5, 1989, IEEE, vol. I, pp. I186, 1189.
Skanadore, W.R., "Toward an understanding and optimal utilization of third-generation bipolar switching transistors", 1982 IEEE.
IC datasheet STR-S6707 through STR-S6709 by Sanken, copyright 1994, Allegro MicroSystems, Inc.
Avant et al., "Analysis of magnetic proportional drive circuits for bipolar junction transistors" PESC 1985, pp. 375-381.
Maksimovic, et al, Impact of Digital Control in Power Electronics, International Symposium on Power Semiconductor Devices and ICS, 2004, pp. 2-22, Boulder, Colorado, USA.
Fairchild Semiconductor, Ballast Control IC, FAN 7711, Rev. 1.0.3, 2007, pp. 1-23, San Jose, California, USA.

Yao, Gang et al, Soft Switching Circuit for Interleaved Boost Converters, IEEE Transactions on Power Electronics, vol. 22, No. 1, Jan. 2007, pp. 1-8, Hangzhou China.
STMicroelectronics, Transition Mode PFC Controller, Datasheet L6562, Rev. 8, Nov. 2005, pp. 1-16, Geneva, Switzerland.
Zhang, Wanfeng et al, A New Duty Cycle Control Strategy for Power Factor Correction and FPGA Implementation, IEEE Transactions on Power Electronics, vol. 21, No. 6, Nov. 2006, pp. 1-10, Kingston, Ontario, Canada.
STMicroelectronics, Power Factor Connector L6561, Rev 16, Jun. 2004, pp. 1-13, Geneva, Switzerland.
Texas Instruments, Avoiding Audible Noise at Light Loads When Using Leading Edge Triggered PFC Converters, Application Report SLUA309A, Mar. 2004—Revised Sep. 2004, pp. 1-4, Dallas, Texas, USA.
Texas Instruments, Startup Current Transient of the Leading Edge Triggered PFC Controllers, Application Report SLUA321, Jul. 2004, pp. 1-4, Dallas, Texas, USA.
Texas Instruments, Current Sense Transformer Evaluation UCC3817, Application Report SLUA308, Feb. 2004, pp. 1-3, Dallas, Texas, USA.
Texas Instruments, BiCMOS Power Factor Preregulator Evaluation Board UCC3817, User's Guide, SLUU077C, Sep. 2000—Revised Nov. 2002, pp. 1-10, Dallas, Texas, USA.
Texas Instruments, Interleaving Continuous Conduction Mode PFC Controller, UCC28070, SLUS794C, Nov. 2007—Revised Jun. 2009, pp. 1-45, Dallas, Texas, USA.
Texas Instruments, 350-W Two-Phase Interleaved PFC Pre-regulator Design Review, Application Report SLUA369B, Feb. 2005—Revised Mar. 2007, pp. 1-22, Dallas, Texas, USA.
Texas Instruments, Average Current Mode Controlled Power Factor Correction Converter using TMS320LF2407A, Application Report SPRA902A, Jul. 2005, pp. 1-15, Dallas, Texas, USA.
Texas Instruments, Transition Mode PFC Controller, UCC28050, UCC28051, UCC38050, UCC38051, Application Note SLUS515D, Sep. 2002—Revised Jul. 2005, pp. 1-28, Dallas, Texas, USA.
Unitrode, High Power-Factor Preregulator, UC1852, UC2852, UC3852, Feb. 5, 2007, pp. 1-8, Merrimack, Maine, USA.
Unitrode, Optimizing Performance in UC3854 Power Factor Correction Applications, Design Note on 39E, 1999, pp. 1-6, Merrimack, Maine, USA.
On Semiconductor Four Key Steps to Design a Continuous Conduction Mode PFC Stage Using the NCP1653, Application Note AND8184/D, Nov. 2004, pp. 1-8, Phoenix, AZ, USA.
Unitrode, BiCMOS Power Factor Preregulator, Texas Instruments, UCC2817, UCC2818, UCC3817, UCC3818, SLUS3951, Feb. 2000—Revised Feb. 2006, pp. 1-25, Dallas, Texas, USA.
Unitrode, UC3854AIB and UC3855A!B Provide Power Limiting with Sinusoidal Input Current for PFC Front Ends, SLUA196A, Design Note DN-66, Jun. 1995—Revised Nov. 2001, pp. 1-6, Merrimack, Maine, USA.
Unitrode, Programmable Output Power Factor Preregulator, UCC2819, UCC3819, SLUS482B, Apr. 2001—Revised Dec. 2004, pp. 1-16, Merrimack, Maine, USA.
Texas Instruments, UCC281019, 8-Pin Continuous Conduction Mode (CCM) PFC Controller, SLU828B, Revised Apr. 2009, pp. 1-48, Dallas, Texas, USA.
http://toolbarpdf.com/docs/functions-and-features-of=inverters. html, Jan. 20, 2011, pp. 1-8.
Zhou, Jinghai, et al, Novel Sampling Algorithm for DSP Controlled 2kW PFC Converter, IEEE Transactions on Power Electronics, vol. 16, No. 2, Mar. 2001, pp. 1-6, Hangzhou, China.
Mammano, Bob, Current Sensing Solutions for Power Supply Designers, Texas Instruments, 2001, pp. 1-36, Dallas, Texas, USA.
Fairchild Semiconductor, Ballast Control IC FAN7532, Rev. 1.0.3, Jun. 2006, pp. 1-16, San Jose, California, USA.
Fairchild Semiconductor, Simple Ballast Controller, FAN7544, Rev. 1.0.0, Sep. 21, 2004, pp. 1-14, San Jose, California, USA.
Texas Instruments, High Performance Power Factor Preregulator, UC2855A/B and UC3855A/B, SLUS328B, Jun. 1998, Revised Oct. 2005, pp. 1-14, Dallas, TX, USA.

(56) References Cited

OTHER PUBLICATIONS

Balogh, Laszlo, et al, Power-Factor Correction with Interleaved Boost Converters in Continuous-Inductr-Current Mode, 1993, IEEE, pp. 168-174, Switzerland.

Cheng, Hung L., et al, A Novel Single-Stage High-Power-Factor Electronic Ballast with Symmetrical Topology, Power Electronics and Motion Control Conference, 2006. IPEMC 2006. CES/IEEE 5th International, Aug. 14-16, 2006, vol. 50, No. 4, Aug. 2003, pp. 759-766, Nat. Ilan Univ., Taiwan.

Fairchild Semiconductor. Theory and Application of the ML4821 Average Current Mode PFC Controllerr, Fairchild Semiconductor Application Note 42030. Rev. 1.0, Oct. 25, 2000, pp. 1-19, San Jose, California, USA.

Garcia, 0., et al, High Efficiency PFC Converter to Meet EN610000302 and A14, Industrial Electronics, 2002. ISIE 2002. Proceedings of the 2002 IEEE International Symposium, vol. 3, pp. 975-980, Div. de Ingenieria Electronica, Univ. Politecnica de Madrid, Spain.

Infineon Technologies AG, Standalone Power Factor Correction (PFC) Controller in Continuous Conduction Mode (CCM), Infineon Power Management and Supply, CCM-PFC, ICE2PCS01, ICE2PCS01 G, Version 2.1, Feb. 6, 2007, p. 1-22, Munchen, Germany.

Lu, et al, Bridgeless PFC Implementation Using One Cycle Control Technique, International Rectifier, 2005, pp. 1-6, Blacksburg, VA, USA.

Brown, et al, PFC Converter Design with IR1150 One Cycle Control IC, International Rectifier, Application Note AN-1 077, pp. 1-18, El Segundo CA, USA.

International Rectifer, PFC One Cycle Control PFC IC, International Rectifier, Data Sheet No. PD60230 rev. C, IR1150(S)(PbF), IR11501(S)(PbF), Feb. 5, 2007, pp. 1-16, El Segundo, CA, USA.

International Rectifier, IRAC1150=300W Demo Board, User's Guide, Rev 3.0, International Rectifier Computing and Communications SBU-AC-DC Application Group, pp. 1-18, Aug. 2, 2005, El Segundo, CO USA.

Lai, Z., et al, A Family of Power-Factor-Correction Controller, Applied Power Electronics Conference and Exposition, 1997. APEC '97 Conference Proceedings 1997., Twelfth Annual, vol. 1, pp. 66-73, Feb. 23-27, 1997, Irvine, CA.

Lee, P, et al, Steady-State Analysis of an Interleaved Boost Converter with Coupled Inductors, IEEE Transactions on Industrial Electronics, vol. 47, No. 4, Aug. 2000, pp. 787-795, Hung Hom, Kowloon, Hong Kong.

Linear Technology, Single Switch PWM Controller with Auxiliary Boost Converter, Linear Technology Corporation, Data Sheet LT 1950, pp. 1-20, Milpitas, CA, USA.

Linear Technology, Power Factor Controller, Linear Technology Corporation, Data Sheet LT1248, pp. 1-12, Milpitas, CA, USA.

\* cited by examiner

DETECTION AND CONTROL MECHANISM FOR TAIL CURRENT IN A BIPOLAR JUNCTION TRANSISTOR (BJT)-BASED POWER STAGE

CROSS-REFERENCE TO RELATED APPLICATIONS

This application is a continuation-in-part of U.S. patent application Ser. No. 14/634,716 to Melanson et al. filed Feb. 27, 2015 and entitled "Switch-Mode Drive Sensing of Reverse Recovery in Bipolar Junction Transistor (BJT)-based Power Converters," which is hereby incorporated by reference in its entirety.

This application is related by subject matter to U.S. patent application Ser. No. 14/280,539 to John Melanson et al. filed May 16, 2014 and entitled "Charge Pump-Based Drive Circuitry for Bipolar Junction Transistor (BJT)-based Power Supply" and is related by subject matter to U.S. patent application Ser. No. 14/280,474 to Ramin Zanbaghi et al. filed May 16, 2014 and entitled "Single Pin Control of Bipolar Junction Transistor (BJT)-based Power Stage," and is related by subject matter to U.S. patent application Ser. No. 14/341,984 to Melanson et al. filed Jul. 28, 2014, and entitled "Compensating for a Reverse Recovery Time Period of the Bipolar Junction Transistor (BJT) in Switch-Mode Operation of a Light-Emitting Diode (LED)-based Bulb," and is related by subject matter to U.S. patent application Ser. No. 13/715,914 to Siddharth Maru filed Dec. 14, 2012 and entitled "Multi-Mode Flyback Control For a Switching Power Converter," and is related to U.S. patent application Ser. No. 14/444,087 to Siddharth Maru et al. filed Jul. 28, 2014, and entitled "Two Terminal Drive of Bipolar Junction Transistor (BJT) for Switch-Mode Operation of a Light Emitting Diode (LED)-Based Bulb," and is related by subject matter to U.S. patent application Ser. No. 14/634,716 to John Melanson et al. filed Feb. 27, 2015, and entitled "Switch-Mode Drive Sensing of Reverse Recovery in Bipolar Junction Transistor (BJT)-Based Power Converters," and is related to U.S. patent application Ser. No. 14/624,475 to Shatam Agarwal et al., filed Feb. 17, 2015, and entitled "Resistance Measurement of a Resistor in a Bipolar Junction Transistor (BJT)-Based Power Stage," each of which is incorporated by reference.

FIELD OF THE DISCLOSURE

The instant disclosure relates to power supply circuitry. More specifically, this disclosure relates to power supply circuitry for lighting devices.

BACKGROUND

Alternative lighting devices to replace incandescent light bulbs differ from incandescent light bulbs in the manner that energy is converted to light. Incandescent light bulbs include a metal filament. When electricity is applied to the metal filament, the metal filament heats up and glows, radiating light into the surrounding area. The metal filament of conventional incandescent light bulbs generally has no specific power requirements. That is, any voltage and any current may be applied to the metal filament, because the metal filament is a passive device. Although the voltage and current need to be sufficient to heat the metal filament to a glowing state, any other characteristics of the delivered energy to the metal filament do not affect operation of the incandescent light bulb. Thus, conventional line voltages in most residences and commercial buildings are sufficient for operation of the incandescent bulb.

However, alternative lighting devices, such as compact fluorescent light (CFL) bulbs and light emitting diode (LED)-based bulbs, contain active elements that interact with the energy supply to the light bulb. These alternative devices are desirable for their reduced energy consumption, but the alternative devices have specific requirements for the energy delivered to the bulb. For example, compact fluorescent light (CFL) bulbs often have an electronic ballast designed to convert energy from a line voltage to a very high frequency for application to a gas contained in the CFL bulb, which excites the gas and causes the gas to glow. In another example, light emitting diode (LEDs)-based bulbs include a power stage designed to convert energy from a line voltage to a low voltage for application to a set of semiconductor devices, which excites electrons in the semiconductor devices and causes the semiconductor devices to glow. Thus, to operate either a CFL bulb or LED-based bulb, the line voltage must be converted to an appropriate input level for the lighting device of a CFL bulb or LED-based bulb. Conventionally, a power stage is placed between the lighting device and the line voltage to provide this conversion. Although a necessary component, this power stage increases the cost of the alternate lighting device relative to an incandescent bulb.

One conventional power stage configuration is the buck-boost power stage. FIG. 1 is an example circuit schematic showing a buck-boost power stage for a light-emitting diode (LED)-based bulb. An input node 102 receives an input voltage, such as line voltage, for a circuit 100. The input voltage is applied across an inductor 104 under control of a switch 110 coupled to ground. When the switch 110 is activated, current flows from the input node 102 to the ground and charges the inductor 104. A diode 106 is coupled between the inductor 104 and light emitting diodes (LEDs) 108. When the switch 110 is deactivated, the inductor 104 discharges into the light emitting diodes (LEDs) 108 through the diode 106. The energy transferred to the light emitting diodes (LEDs) 108 from the inductor 104 is converted to light by LEDs 108.

The conventional power stage configuration of FIG. 1 provides limited control over the conversion of energy from a source line voltage to the lighting device. The only control available is through operation of the switch 110 by a controller. However, that controller would require a separate power supply or power stage circuit to receive a suitable voltage supply from the line voltage. Additionally, the switch 110 presents an additional expense to the light bulb containing the power stage. Because the switch 110 is coupled to the line voltage, which may be approximately 120-240 Volts RMS with large variations, the switch 110 must be a high voltage switch, which are large, difficult to incorporate into small bulbs, and expensive.

Shortcomings mentioned here are only representative and are included simply to highlight that a need exists for improved power stages, particularly for lighting devices and consumer-level devices. Embodiments described here address certain shortcomings but not necessarily each and every one described here or known in the art.

SUMMARY

A bipolar junction transistor (BJT) may be used as a switch for controlling a power stage of a lighting device, such as a light-emitting diode (LED)-based light bulb. Bipolar junction transistors (BJTs) may be suitable for high voltage applications, such as for use in the power stage and for coupling to a line voltage. Further, bipolar junction transistors (BJTs) are lower cost devices than conventional high voltage field effect transistors (HV FETs). Thus, implementations of power stages having bipolar junction transistor (BJT) switches may be lower cost than power stage implementations having field effect transistor (FET) switches.

In certain embodiments, the BJT may be emitter-controlled through the use of a field-effect transistor (FET) switch attached to an emitter of the BJT. A controller may toggle the switch to inhibit or allow current flow through the BJT. Although current may be inhibited after the FET switch is turned off, current through the BJT may not immediately decrease to zero. Instead, a tail current may flow through the BJT causing a delay in turning off of the BJT. This tail current contributes to inefficiencies in the power stage containing the BJT and contributes to unpredictable behavior of the power stage containing the BJT. The tail current may be measured through circuitry coupled to the BJT. The decay time of the tail current may be used as an indicator of whether an optimal forward base current was applied to the BJT while the BJT was switched on. By comparing the decay time and/or the tail current to certain thresholds corresponding to optimal or desired values, a controller coupled to the BJT may determine whether to increase or decrease forward base current to the BJT while the BJT is switched on. This closed-loop feedback system may be used to set an appropriate forward base current value during later switching cycles. The controller may also use similar comparisons involving the decay time to adjust a pull down base current source coupled to the BJT during a reverse recovery time period of later switching cycles.

According to one embodiment, a method may include switching on a control signal to operate a bipolar junction transistor (BJT) for a first time period to charge an energy storage device; driving forward base current to a base of the bipolar junction transistor (BJT) during the first time period at a first current level; switching off the control signal to operate the bipolar junction transistor (BJT) for a second time period to discharge the energy storage device to a load; determining a time period for current through the bipolar junction transistor (BJT) to decay to below a threshold current value after switching off the control signal; and/or adjusting the first current level based, at least in part, on the determined time period.

In some embodiments, the method may also include coupling a reverse base current source to the base of the bipolar junction transistor (BJT) after switching off the control signal, wherein the step of determining the time period for current to decay may include measuring a base voltage at the base of the bipolar junction transistor (BJT) while the reverse base current source is coupled to the base of the bipolar junction transistor (BJT); and/or the method may also include repeating the steps of switching on the control signal, driving forward base current, and switching off the control signal.

In certain embodiments, the step of adjusting the first current level comprises, when the determined time period is above a threshold value, reducing the first current level of the forward base current; the step of determining the time period further may include comparing the measured base voltage to a first threshold voltage, and after the measured base voltage crosses the first threshold voltage: decoupling the reverse base current source from the base of the bipolar junction transistor (BJT), coupling a sense resistor to the base of the bipolar junction transistor (BJT), and/or measuring the base voltage at the base of the bipolar junction transistor (BJT) by measuring a voltage across the sense resistor; the step of determining the time period may include comparing the measured voltage across the sense resistor with a second voltage threshold corresponding to the threshold current value, and after the measured voltage across the sense resistor crosses the second voltage threshold, determining the time period for current to delay as a sum of a time for the measured base voltage to cross the first threshold voltage and a time for the measured sense resistor voltage to cross the second voltage threshold; and/or the step of discharging the energy storage device to the load comprises discharging the energy storage device to a plurality of light emitting diodes (LEDs).

According to another embodiment, an apparatus may include an integrated circuit (IC) configured to couple to a bipolar junction transistor (BJT), wherein the integrated circuit (IC) may include a switch configured to couple to an emitter of the bipolar junction transistor (BJT); and/or a controller coupled to the switch and configured to control delivery of power to a load by operating the switch based, at least in part, on a control signal. The controller may be configured to perform the steps of switching on the control signal to operate the bipolar junction transistor (BJT) for a first time period to charge an energy storage device; driving forward base current to a base of the bipolar junction transistor (BJT) during the first time period at a first current level; switching off the control signal to operate the bipolar junction transistor (BJT) for a second time period to discharge the energy storage device to the load; determining a time period for current through the bipolar junction transistor (BJT) to decay to below a threshold current value after switching off the control signal; and/or adjusting the first current level based, at least in part, on the determined time period.

In some embodiments, the integrated circuit (IC) may include a first switch coupled to the base of the bipolar junction transistor; a reverse base current source coupled to the first switch; a first sense amplifier coupled to the switch and to a first reference voltage input node; a resistor; a second switch coupled to the base of the bipolar junction transistor (BJT); and/or a second comparator coupled to the resistor and a second reference voltage input node.

In certain embodiments, the step of adjusting the first current level comprises, when the determined time period is above a threshold value, reducing the first current level of the forward base current; the step of discharging the energy storage device to the load may include discharging the energy storage device to a plurality of light emitting diodes (LEDs); and/or the controller may be further configured to perform the step comprising repeating the steps of switching on the control signal, driving forward base current, and switching off the control signal.

In certain embodiments, the controller may be configured to perform the steps of activating the first switch to couple the reverse base current source to the base of the bipolar junction transistor (BJT) after switching off the control signal; measuring, with the first sense amplifier, a base voltage at the base of the bipolar junction transistor (BJT) while the reverse base current source is coupled to the base of the bipolar junction transistor (BJT); comparing the measured base voltage to the first reference voltage; after the measured base voltage crosses the first reference voltage, deactivating the first switch to decouple the reverse base current source from the base of the bipolar junction transistor (BJT); comparing the measured base voltage across the sense resistor with the second reference voltage; and/or after the measured base voltage crosses the second reference voltage, determining the time period for current to delay as a sum of a time for the measured base voltage to cross the first reference voltage and a time for the measured base voltage to cross the second reference voltage.

According to a further embodiment, an apparatus may include a lighting load comprising a plurality of light emitting diodes (LEDs); a bipolar junction transistor (BJT) comprising a base, an emitter, and a collector, wherein the collector of the bipolar junction transistor (BJT) is coupled to an input node; and/or an integrated circuit (IC) configured to couple to a bipolar junction transistor (BJT). The IC may include a switch configured to couple to an emitter of the bipolar junction transistor (BJT); and/or a controller coupled to the switch and configured to control delivery of power to a load by operating the switch based, at least in part, on a generated control signal. The controller may be configured to perform the steps of switching on the control signal to operate the bipolar junction transistor (BJT) for a first time period to charge an energy storage device; driving forward base current to a base of the bipolar junction transistor (BJT) during the first time period at a first current level; switching off the control signal to operate the bipolar junction transistor (BJT) for a second time period to discharge the energy storage device to the load; determining a time period for current through the bipolar junction transistor (BJT) to decay to below a threshold current level after switching off the control signal; and/or adjusting the first current level based, at least in part, on the determined time period.

In some embodiments, the integrated circuit (IC) may also include a first switch coupled to the base of the bipolar junction transistor; a reverse base current source coupled to the first switch; and a first sense amplifier coupled to the switch and to a first reference voltage input node configured to receive a first reference voltage. In this embodiment, the controller may be configured to perform the steps of activating the first switch to couple the reverse base current source to the base of the bipolar junction transistor (BJT) after switching off the control signal; and/or measuring, with the first sense amplifier, a base voltage at the base of the bipolar junction transistor (BJT) while the reverse base current source is coupled to the base of the bipolar junction transistor (BJT). The controller may also be configured to perform the steps of comparing the measured base voltage to the first reference voltage; and/or after the measured base voltage crosses the first threshold voltage, deactivating the first switch to decouple the reverse base current source from the base of the bipolar junction transistor (BJT).

In some embodiments, the IC may also include a resistor; a second switch coupled to the base of the bipolar junction transistor (BJT); and/or a second comparator coupled to the sense resistor and a second reference voltage input node configured to receive a second reference voltage. In this embodiment, the controller may be configured to perform the steps of activating the second switch to couple the resistor to the base of the bipolar junction transistor (BJT) after de-activating the first switch; and/or measuring, with the second sense amplifier, the base voltage at the base of the bipolar junction transistor (BJT). The controller may also be configured to perform the steps of comparing the measured base voltage across the resistor with the second reference voltage; and/or after the measured base voltage crosses the second reference voltage, determining the time period for current to delay as a sum of a time for the measured base voltage to cross the first reference voltage and a time for the measured base voltage to cross the second reference voltage.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

A bipolar junction transistor (BJT) may control delivery of power to a lighting device, such as light emitting diodes (LEDs). The bipolar junction transistor (BJT) may be coupled to a high voltage source, such as a line voltage, and may control delivery of power to the LEDs. The bipolar junction transistor (BJT) is a low cost device that may reduce the price of alternative light bulbs. In some embodiments, a controller for regulating energy transfer from an input voltage, such as a line voltage, to a load, such as the LEDs, may be coupled to the BJT through two terminals. For example, the controller may regulate energy transfer by coupling to a base of the BJT and an emitter of the BJT. The controller may obtain input from the base and/or emitter of the BJT and apply control signals to circuitry configured to couple to a base and/or emitter of the BJT.

Figure 1:
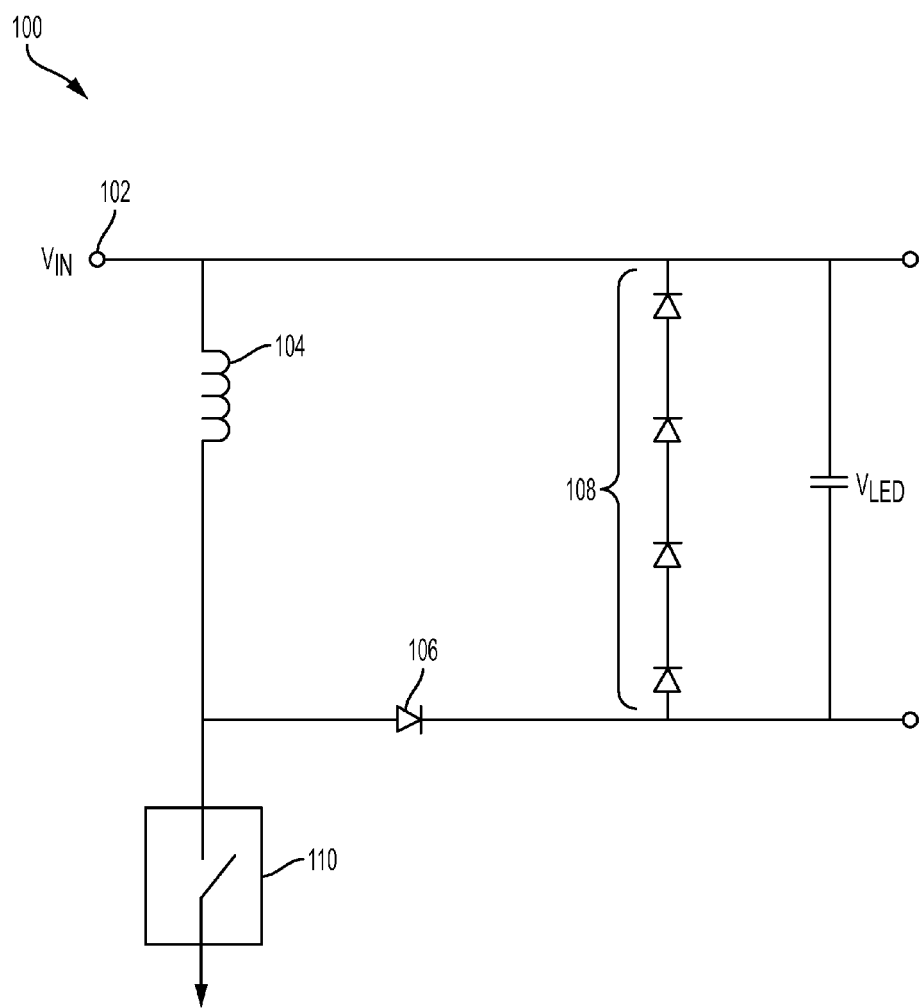
FIG. 1 is an example circuit schematic illustrating a buck-boost power stage for a light-emitting diode (LED)-based bulb in accordance with the prior art.
Figure 2:
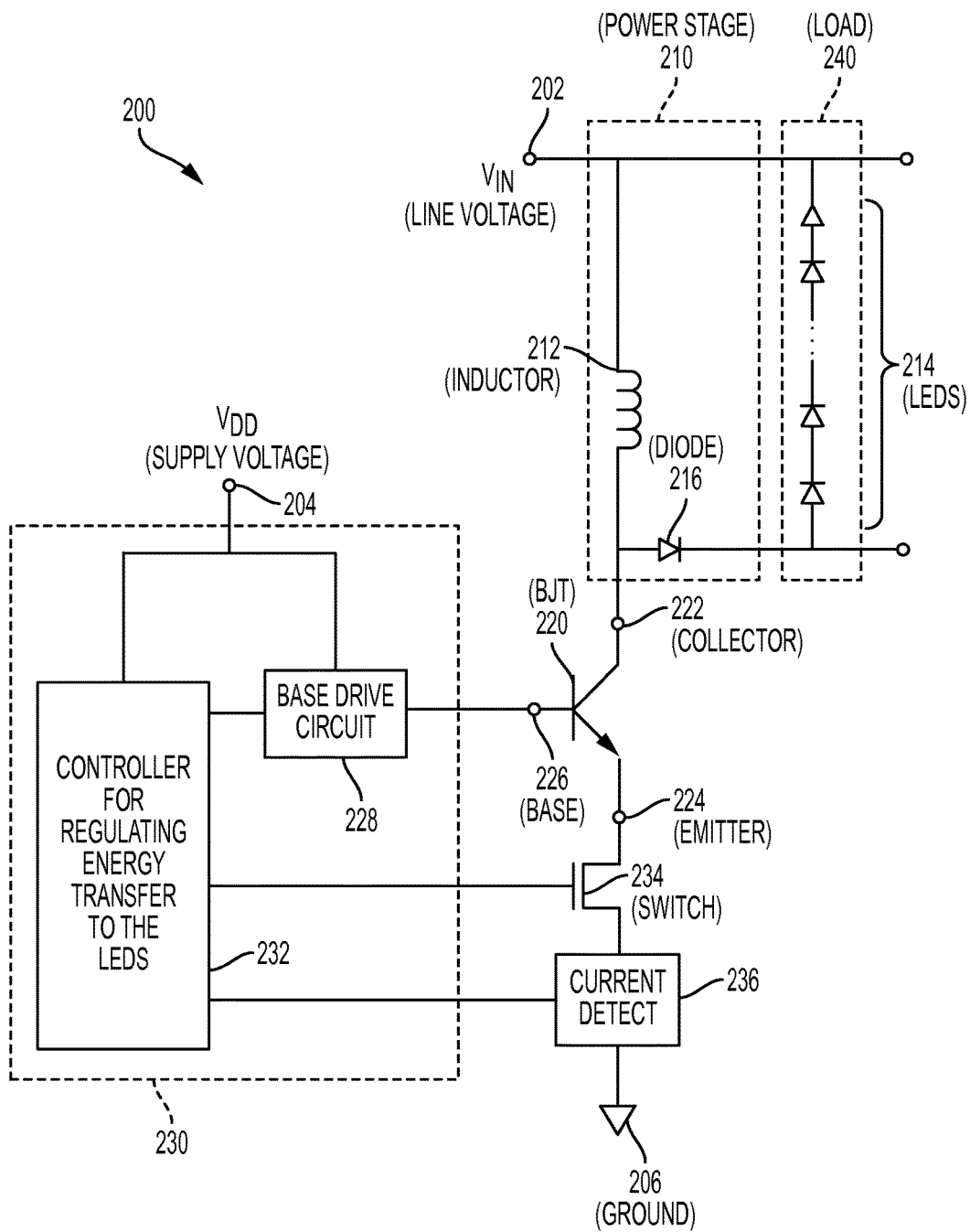
FIG. 2 is an example circuit schematic illustrating a power stage having an emitter-controlled bipolar junction transistor (BJT) according to one embodiment of the disclosure.

FIG. 2 is an example circuit schematic illustrating a power stage having an emitter-controlled bipolar junction transistor (BJT) according to one embodiment of the disclosure. A circuit 200 may include a bipolar junction transistor (BJT) 220 having a collector node 222, an emitter node 224, and a base node 226. The collector 222 may be coupled to a high voltage input node 202 and a lighting load 214, such as a plurality of light emitting diodes (LEDs). An inductor 212 and a diode 216 may be coupled between the high voltage input node 202 and the LEDs 214. The inductor 212 and the diode 216 and other components (not shown) may be part of a power stage 210. The LEDs 214 may generically be any load 240.

Figure 3:
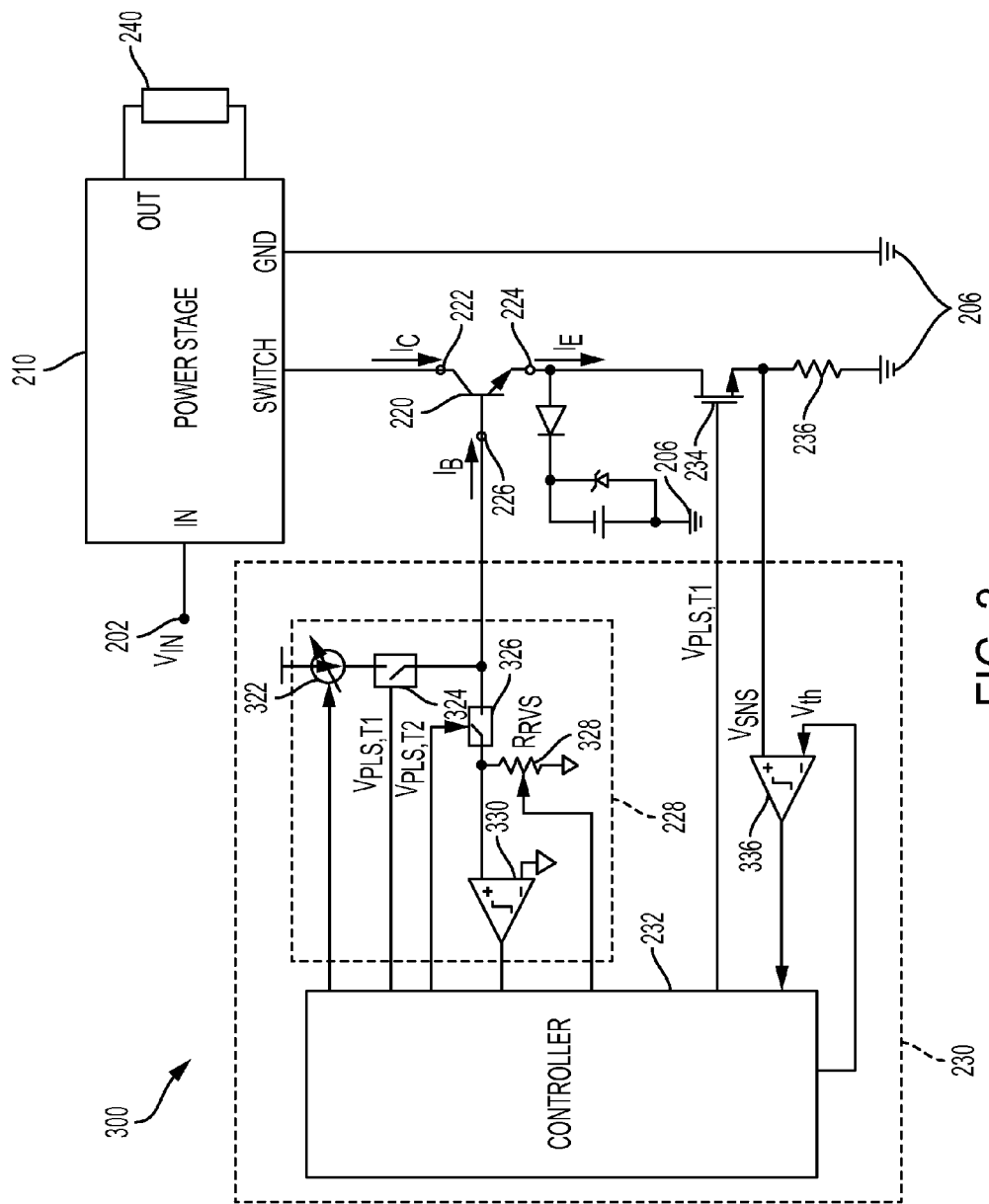
FIG. 3 is an example circuit schematic illustrating control of a bipolar junction transistor (BJT) through two terminals according to one embodiment of the disclosure.

The emitter node 224 of the BJT 220 may be coupled to an integrated circuit (IC) 230 through a switch 234, and a current detect circuit 236. The switch 234 may be coupled in a current path from the emitter node 224 to a ground 206. The current detect circuit 236 may be coupled between the switch 234 and the ground 206. The controller 232 may control power transfer from the input node 202 to the lighting load 214 by operating the switch 234 to couple and/or disconnect the emitter node 224 of the BJT 220 to the ground 206. The current detect circuit 236 may provide feedback to the controller 232 regarding current flowing through the BJT 220 while the switch 234 is turned on to couple the emitter node 224 to the ground 206. As shown in FIG. 3, the switch 234 and the current detect circuit 236, such as a resistor 236 are not part of the IC 230. In another embodiment, the switch 234 and the resistor 236 may be part of the IC 230 and integrated with the controller 232 and other components such as those shown in FIG. 2.

The base node 226 of the BJT 220 may also be coupled to the IC 230, such as through a base drive circuit 228. The base drive circuit 228 may be configured to provide a relatively fixed bias voltage to the base node 226 of the BJT 220, such as during a time period when the switch 234 is switched on. The base drive circuit 228 may also be configured to dynamically adjust base current to the BJT 220 under control of the controller 232. The base drive circuit 228 may be controlled to maintain conduction of the BJT 220 for a first time period. The base drive circuit 228 may be disconnected from the BJT 220 to begin a second flyback time period with the turning off of the BJT 220.

The controller 232 may control delivery of power to the lighting load 214 in part through the switch 234 at the emitter node 224 of the BJT 220. When the controller 232 turns on the switch 234, current flows from the high voltage input node 202, through the inductor 212, the BJT 220, and the switch 234, to the ground 206. During this time period, the inductor 212 charges from electromagnetic fields generated by the current flow. When the controller 232 turns off the switch 234, current flows from the inductor 212, through the diode 216, and through the lighting load 214 after a reverse recovery time period of the BJT 220 completes and a sufficient voltage accumulates at collector node 222 to forward bias diode 216 of the power stage 210. The lighting load 214 is thus powered from the energy stored in the inductor 212, which was stored during the first time period when the controller 232 turned on the switch 234. The controller 232 may repeat the process of turning on and off the switch 234 to control delivery of energy to the lighting load 214. Although the controller 232 operates switch 234 to start a conducting time period for the BJT 220 and to start a turn-off transition of the BJT 220, the controller 232 may not directly control conduction of the BJT 220. In the circuit 200, control of delivery of energy from a high voltage source at input node 202 may be possible without exposing the IC 230 or the controller 232 to the high voltage source.

The controller 232 may be programmed to determine the first duration of time to hold the switch 234 on and the second duration of time to hold the switch 234 off based on feedback from the current detect circuit 236. For example, the controller 232 may turn off the switch 234 after the current detect circuit 236 detects current exceeding a first current threshold. A level of current detected by the current detect circuit 236 may provide the controller 232 with information regarding a charge level of the inductor 212. By selecting the first duration of the time and the second duration of time, the controller 232 may regulate an average current output to the LEDs 214. As described below and with reference to FIG. 3 and FIG. 4 below, the controller 232 may also regulate operation of the BJT 220 by controlling other components in addition to the switch 234.

Additional details for one configuration of the IC 230 are shown in FIG. 3. FIG. 3 is an example circuit schematic illustrating control of a bipolar junction transistor (BJT) through two terminals according to one embodiment of the disclosure. A circuit 300 may include, within the IC 230, a forward base current source 322 coupled to the base node 226 by a forward base switch 324. The current source 322 may provide a variable base current adjustable by the controller 232. The switch 324 may be switched on by the controller 232 with a control signal $V_{PLS,T1}$. The control signal $V_{PLS,T1}$ may also be applied to the switch 234 at the emitter of the BJT 220. As described above, the switch 234 may be turned on to charge the power stage 210 during a first time period. The switch 324 may also be turned on during the same time period, and current from the source 322 applied to the BJT 220 to allow the BJT 220 to remain turned on and in a conducting state. In one embodiment, the controller 232 may also control the current source 322 to increase a base current to the BJT 220 proportional to an increase in collector current through the BJT 220. The $V_{PLS,T1}$ control signal may be generated by monitoring a current detect resistor 236 with a comparator 336. For example, when the current sensed by resistor 236 reaches a threshold voltage, $V_{th}$, the comparator 336 output may switch states and the controller 232 may then switch a state of the $V_{PLS,T1}$ control signal.

One method of controlling the BJT 220 by the controller 232 is to dynamically adjust a base current into or out of the base node 226 or a base voltage at the base node 226. For example, a reverse recovery time period of the BJT 220 may be controlled by adjusting a level for the forward base current source 322. The BJT 220 may also be controlled through the use of a pull down current source, also referred to as a reverse base current source, as illustrated in FIG. 4.

Figure 4:
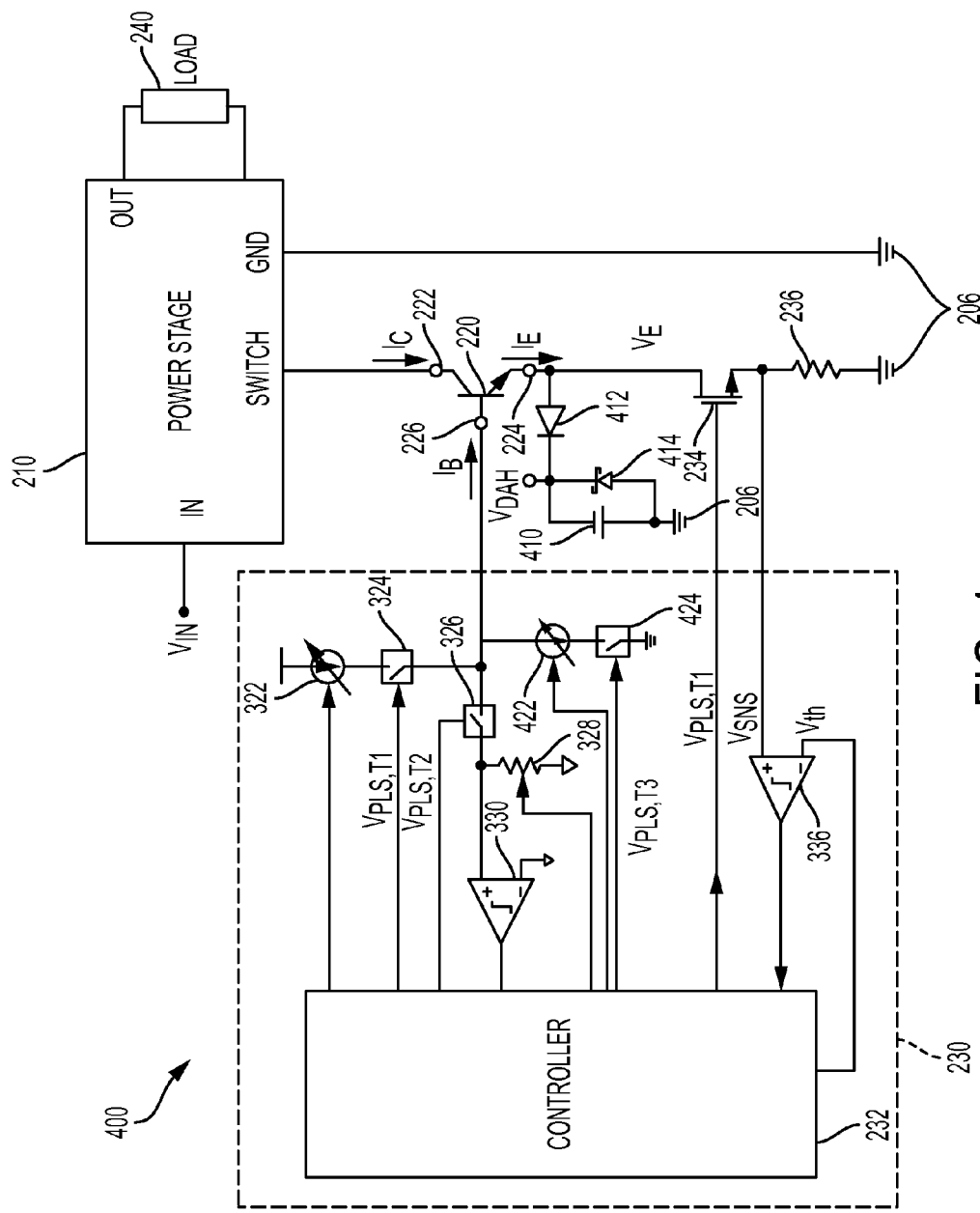
FIG. 4 is an example circuit schematic illustrating control of a bipolar junction transistor (BJT) with a forward and a reverse base current source according to one embodiment of the disclosure.

FIG. 4 is an example circuit schematic illustrating control of a bipolar junction transistor (BJT) with a forward and a reverse base current source according to one embodiment of the disclosure. A circuit 400 may be similar to the circuit 300 of FIG. 3, but may also include a reverse base current source 422 and a second reverse base switch 424. The switch 424 may be controlled by a $V_{PLS,T3}$ control signal generated by the controller 232. The controller 232 may switch on the switch 424 and control the current source 422 during a portion of or the entire reverse recovery time period of the BJT 220 to adjust the duration of the reverse recovery time period. In the circuit 400, the reverse recovery time period may thus be controlled by varying the resistor 328 and/or controlling the current source 422. The use of current source 422 may be advantageous over varying the resistor 328 in certain embodiments by allowing the controller 232 to set a current output level without measuring the base voltage of the BJT 220. For example, the controller 232 may set the current source 422 to a value proportional to the collector current $I_C$ to reduce the reverse recovery time period. In one embodiment, the value may be between approximately 20% and 50% of peak collector current $I_C$.

The forward base current source 322 and the reverse base current source 422 may be controlled by the controller 232 to modify a reverse recovery time period of the BJT 220 while the switch 234 is switched off. The current sources 322 and 422 may also be controlled by the controller 232 to obtain an optimal operating region for the BJT within a saturating operating region. For example, the current source 322 may be controlled to reduce excess base charge accumulation on the BJT 220 to reduce inefficiencies in operating the BJT 220. In particular, operating the current source 322 at a current level above an optimal current level results in a delay time for the switching off of the BJT 220 after the switch 234 is turned off. This delay time, shown as a tail current in a graph of the collector current $I_C$ at collector node 222, causes unnecessary power dissipation.

Figure 5A:
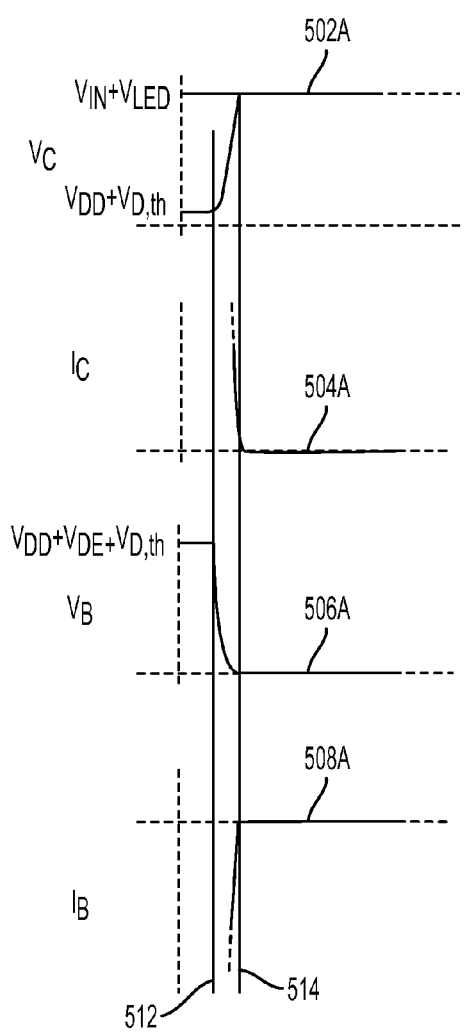
FIGS. 5A and 5B are example graphs illustrating operation of switching off the bipolar junction transistor (BJT) after operating at optimal and non-optimal forward base current values according to one embodiment of the disclosure.
Figure 5B:
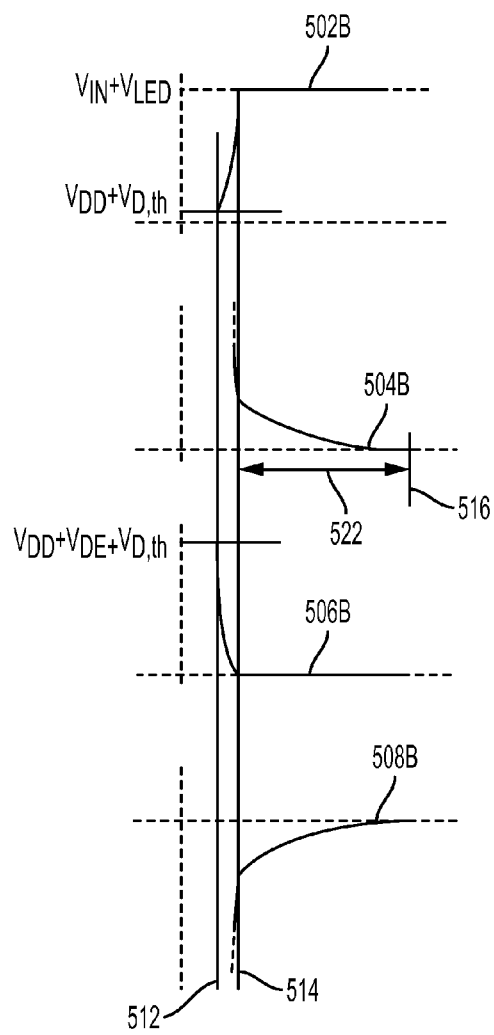

FIG. 5 are example graphs illustrating operation of switching off the bipolar junction transistor (BJT) after operating at optimal and non-optimal forward base current values according to one embodiment of the disclosure. Graphs 502A and 502B illustrate a collector voltage $V_C$ at collector node 222; graphs 504A and 504B illustrate a collector current $I_C$ into the collector node 222; graphs 506A and 506B illustrate a base voltage $V_B$ at base node 226; and graphs 508A and 508B illustrate a base current $I_B$ into base node 222. Graphs 502A, 504A, 506A, and 508A illustrate voltage and current around the BJT 220 while the BJT 220 is switching off after forward base current to the BJT was set at an approximately optimal level. An optimal level of forward base current is a current level that results in approximately the shortest delay time for turning off the BJT, and thus the smallest current tail on the collector current $I_C$. Optimum base current value may depend, for example, on the operation point, temperature, load current, BJT type, etc.

Graphs in column (a) of FIG. 5 correspond to operation when base current $I_R$, is approximately an optimal value $I_{fb,opt}$. Graphs 502B, 504B, 506B, and 508B illustrate voltage and current at nodes around the BJT 220 while the BJT 220 is switching off after forward base current to the BJT was set at a current level above the optimal level. Time 512 refers to a detected end of a reverse recovery period for the BJT 220, such as may be detected by comparator 330. Referring to graph 506A, base voltage $V_B$ begins decreasing after the reverse recovery period. While the base voltage $V_B$ is decreasing, the collector voltage $V_C$ of graph 502A rises to $V_{IN}+V_{LED}$. Consequently, the collector current $I_C$ of graph 504A and the base current $I_B$ of graph 508A approach zero. The rapid decrease of collector current IC of graph 504A is a result of an optimal amount of base current to the BJT 220.

However, the BJT 220 behaves differently when the base current during operation is too high. Graphs in column (b) of FIG. 5 correspond to operation when base current $I_{fb}$ is above an optimal value $I_{fb,opt}$. Excessive charge at the base of the BJT 220 caused by operating above the optimal value $I_{fb,opt}$ causes a tail collector current $I_C$ shown in graph 504B after time 514 for a delay time 522 until time 516. During this time, the BJT base-emitter diode may be off and this tail collector current $I_C$ flows from the collector to the base of the BJT as a result of the collector-base diode reverse-recovery discharge. Because the tail collector current $I_C$ flows during a time when the collector voltage $V_C$ is relatively high, the tail collector current $I_C$ results in an undesired increase in the power dissipation by the BJT.

Referring to graph 506B, when base current $I_{fb}$ is greater than an optimal value $I_{fb,opt}$, the base voltage $V_B$ collapses toward zero when the base current $I_B$ of graph 508B is smaller than the pull down current value $I_{pd}$, which may occur close to time 514. Time 514 refers to a switching off of the BJT 220, which ideally occurs shortly after the end of the reverse recovery period. After time 514, the collector voltage $V_C$ of graph is approximately $V_{IN}+V_{LED}$. The increased collector voltage $V_C$ directs current from the inductor 212 to the LEDs 214. When the forward base current is above the optimal current level while the BJT 220 is switched on, the base node 226 of the BJT 220 accumulates excess charge. This charge must be discharged after the forward base current is turned off before the BJT 220 switches off. Thus, the excess base charge contributes to an unintended delay time 522 in switching off the BJT 220, during which the excess base charge is drained from the base node 226.

The reverse recovery phase preceding time 512 reduces the BJT 220 on-time power dissipation and also allows harvesting of energy to a chip supply $V_{dd}$. This reverse recovery time is created by over driving the BJT 220 with excess base current while the BJT 220 is on. However, towards the end of the reverse recovery time and just after time 512, the current source 422 may be turned off. At this time switch 234 is off, current source 422 is off, current source 322 is off, and BJT 220 is in the process of switching off but collector base reverse recovery continues during which tail current is flowing through the collector base diode of BJT 220. Any tail current during delay 522 will dissipate power in BJT 220 because during this time the base voltage $V_B$ is approximately zero and the collector voltage $V_C$ is relatively high. Detection of delay 522 and adjustments during later switching cycles by optimizing $I_{fb}$ provided by current source 322 and pull down base current $I_{pd}$ provided by current source 422 to minimize the delay 522 and thus reduce power consumption.

When the forward base current level applied by the current source 322 is not optimal, such as when the forward base current level is above an optimal level, the accumulated excess charge at the base node 226 results in a delay in switching off of the BJT 220, increasing power dissipation by the BJT 220. Graph 504B illustrates this delay time. A delay time 522 of graph 504B illustrates the current tail through the BJT 220 due to the BJT 220 remaining on after an emitter switch is switched off.

To reduce or eliminate the increase in BJT power dissipation described above, a closed-loop monitoring and controlling system may be implemented within a controller coupled to the BJT 220. In one embodiment, a detection mechanism for the tail current may be based on the detection of two different time events and determining a time between those two events and comparing that determined time with one or more threshold time values.

Figure 6:
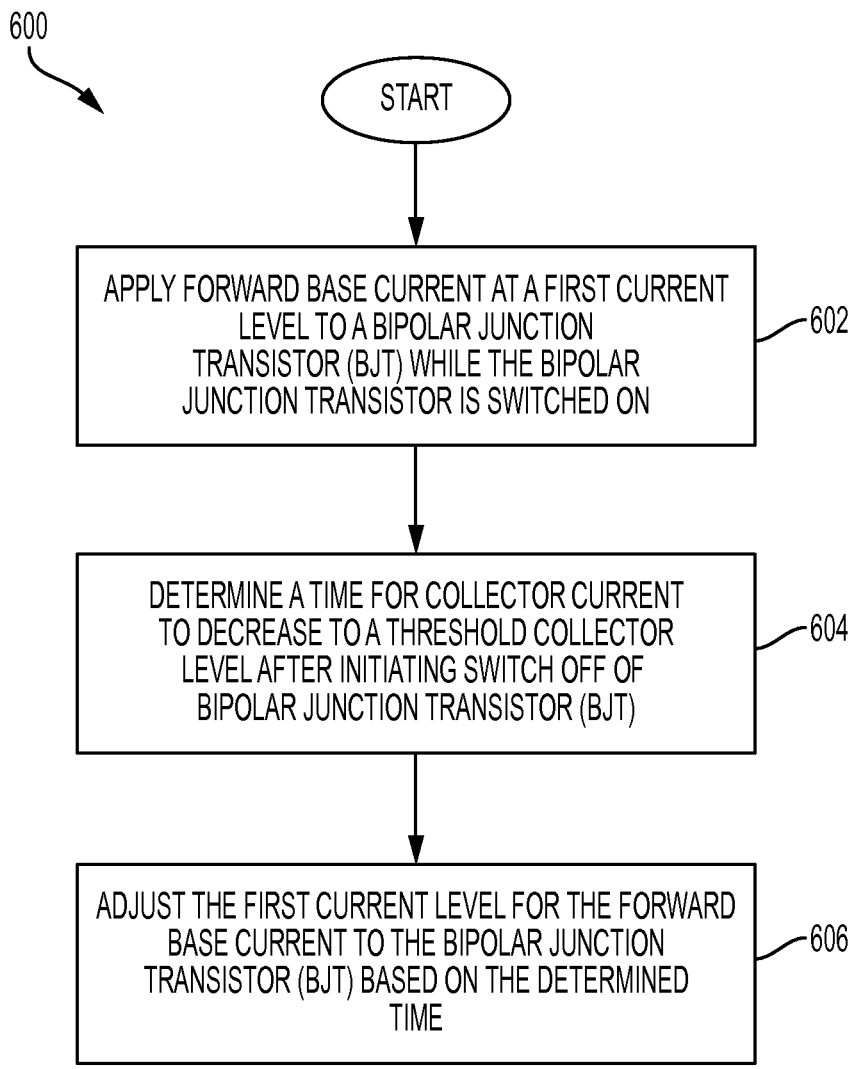
FIG. 6 is an example flow chart illustrating a method of controlling the bipolar junction transistor (BJT) to reduce delay time in switching off the BJT according to one embodiment of the disclosure.

FIG. 6 is an example flow chart illustrating a method of controlling the bipolar junction transistor (BJT) to reduce delay time in switching off the BJT according to one embodiment of the disclosure. A method 600 may begin at block 602 with a controller applying a forward base current $I_{fb}$ at a first current level to a bipolar junction transistor (BJT) while the BJT is switched on. In one embodiment, the first current level may be sufficient to drive the BJT into a saturation operating region, such that $$I_{fb} > \frac{I_L}{\beta},$$

where $I_{fb}$ is the forward base current, $I_L$ is the current through the inductor of the power stage, and $\beta$ is a characteristic of the BJT. A controller or circuitry coupled to the BJT may initiate the switching off of the BJT, such as by disconnecting the forward base current $I_{fb}$ or turning off an emitter-coupled switch. In some embodiments, a pull down base current $I_{pd}$ may be applied to the base of the BJT to accelerate the switching off process. The pull down base current $I_{pd}$ value may be set, for example, to approximately $$I_{pd} = \frac{I_{peak}}{4},$$

where $I_{pd}$ is a base pull down current and $I_{peak}$ is a peak collector current $I_C$ at the BJT.

Then, at block 604, the controller may monitor the BJT and determine a delay time for the BJT to switch off. For example, the controller may determine when the collector current decreases below a threshold collector level, such as approximately zero, after initiating switch off of the bipolar junction transistor (BJT). A time period comprising the switching on of the BJT, the time the BJT is on, the switching off of the BJT, and the time the BJT is off may be referred to as a switching cycle. The switching cycle may repeat at, for example, periodic intervals and the determination of block 604 and adjustment of block 606 repeat for some or each of the switching cycles.

At block 606, the first current level of forward base current applied at block 602 may be adjusted for a later switching cycle. The adjustment may be based on one or more thresholds. For example, when the determined delay time of block 604 exceeds a threshold time the first current level may be decreased. A delay time of block 604 longer than a threshold time indicates excess charge was stored on the base of the BJT while the BJT was switched on. Decreasing the first current level in a later switching cycle may decrease the excess base current charge on the BJT resulting in a more optimal forward base current. The adjustment to the first current level may be applied, for example, in the next switching cycle after the delay time is determined at block 604 or a later switching cycle. In some embodiments, multiple thresholds may be compared to the determined delay time to determine an amount of the adjustment to the first current level to make at block 606. In other embodiments, a fixed step level may be used to adjust the first current level or an algorithm may be used to adjust the first current level.

Figure 7:
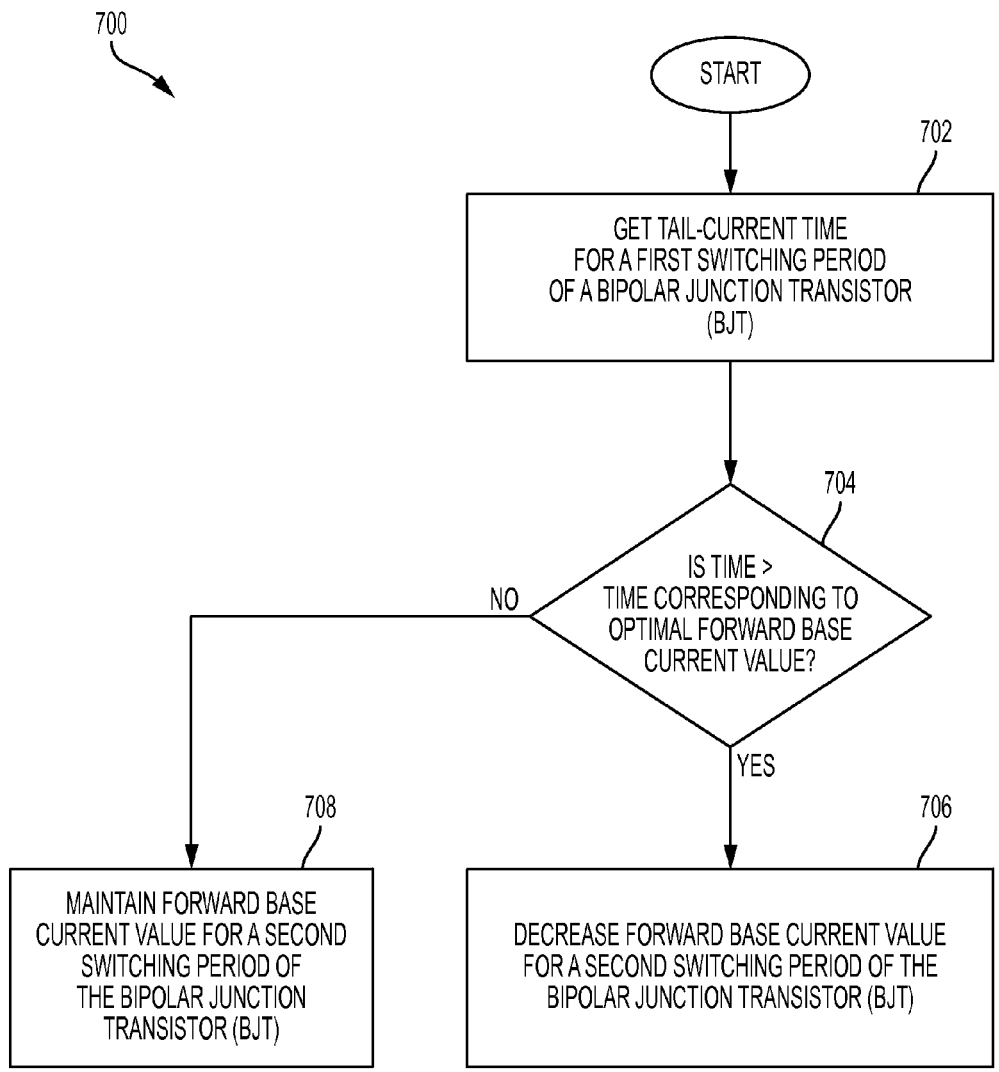
FIG. 7 is an example flow chart illustrating a method of selecting a forward base current value for operating the bipolar junction transistor to reduce delay time in switching off the BJT according to one embodiment of the disclosure.

The use of a single threshold for adjusting the first current level is illustrated in the method of FIG. 7. FIG. 7 is an example flow chart illustrating a method of selecting a forward base current value for operating the bipolar junction transistor to reduce delay time in switching off the BJT according to one embodiment of the disclosure. A method 700 begins at block 702 with obtaining a tail-current time for a first switching period of a bipolar junction transistor (BJT). At block 704, it is determined whether the tail-current time of block 702 is greater than a time corresponding to an optimal forward base current value. If so, the method 700 continues to block 706 to decrease the forward base current value for a second switching period of the bipolar junction transistor (BJT). If the time is not greater than the threshold time at block 704, then the method 700 proceeds to block 708 to maintain the forward base current value for a second switching period of the bipolar junction transistor (BJT). Although block 708 describes maintaining the forward base current value, the forward base current value may also be increased based on other parameters within the controller, such as to adjust a reverse recovery time period of the BJT.

Figure 8:
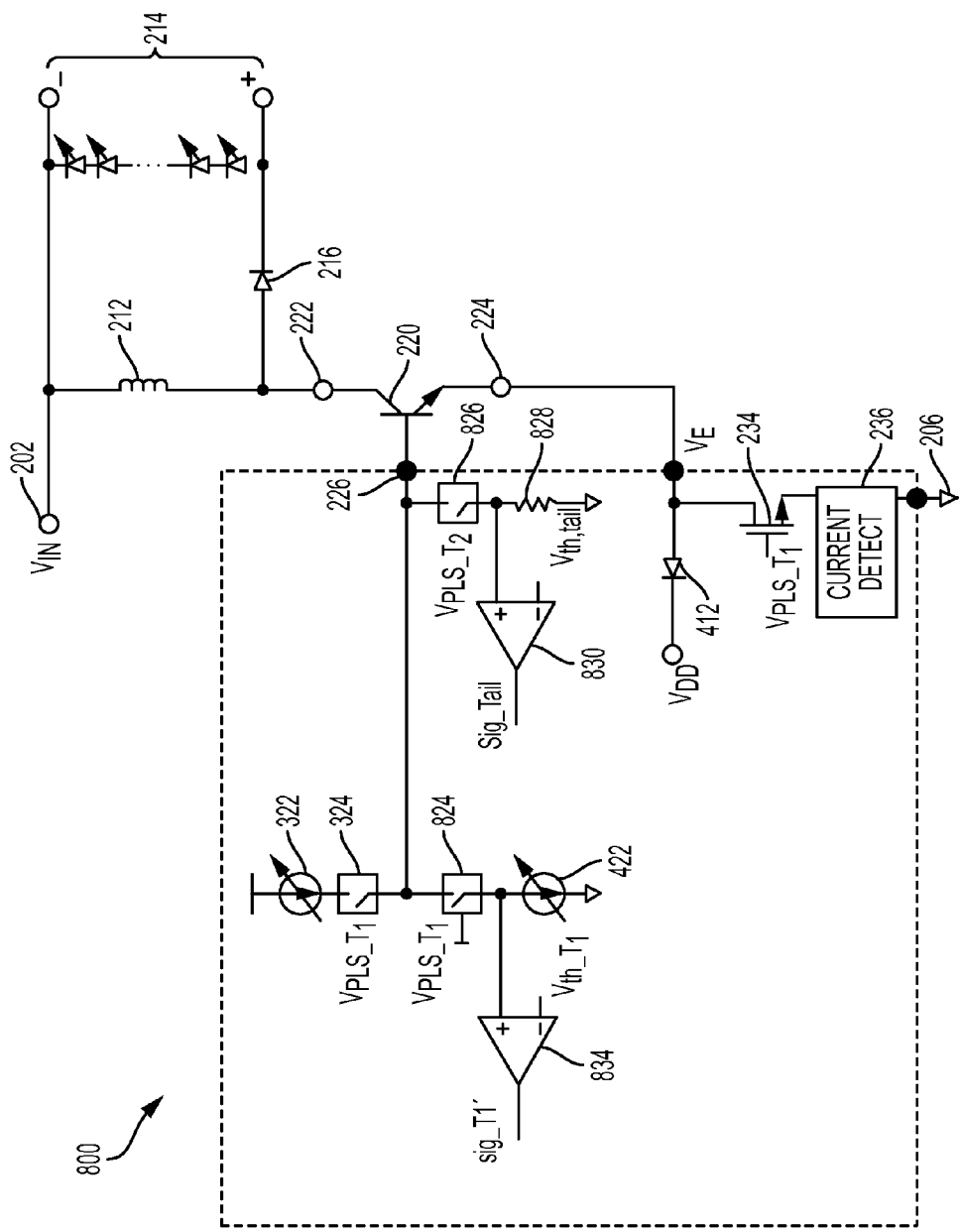
FIG. 8 is an example circuit schematic illustrating an integrated circuit for measuring and controlling delay time of switching off a bipolar junction transistor (BJT) according to one embodiment of the disclosure.

FIG. 8 is an example circuit schematic illustrating an integrated circuit for measuring and controlling delay time of switching off a bipolar junction transistor (BJT) according to one embodiment of the disclosure. A circuit 800 of FIG. 8 illustrates one embodiment of a closed-loop detection and compensation system for a BJT-based power stage. A comparator 834 may determine when a first event occurs. The comparator 834 may be coupled between a switch 824 and the pull down current source 422. When the switch 824 is closed to a conducting state by a control signal $V_{PLS\_T1}$, the comparator 834 is coupled between the base node 226 of the BJT 220 and the pull down current source 422. The comparator 834 may compare the voltage at the base node 226 with a threshold voltage $V_{TH,T1}$, and output signal sig_T1'. Information in the output signal sig_T1' may indicate time 512 of FIG. 5. For example, the output signal sig_T1' switching from high to low or low to high may indicate when time 512 occurs.

A comparator 830 may determine when a second event occurs. The comparator 830 may be coupled between a switch 826 and a sense resistor 828. When the switch 826 is closed to a conducting state by a control signal $V_{PLS\_T3}$, the comparator 830 is coupled between the base node 226 of the BJT 220 and the sense resistor 828. The comparator 830 may compare the voltage at the base node 226 with a threshold voltage $V_{th,tail}$ and output signal sig_Tail. Information in the output signal sig_Tail may indicate time 516 of FIG. 5.

A controller, such as the controller 232 of FIG. 2, may use information from the output signals sig_T1' and sig_Tail to operate the circuit 800 of FIG. 8 or other circuits, such as those illustrated in FIG. 2, FIG. 3, and FIG. 4. For example, the controller 232 may determine whether the output signals sig_T1' and sig_Tail indicate that an approximately optimal amount of forward base current is driven to the BJT 220 during operation. The controller 232 may then adjust the forward base current source 322 during operation of the BJT 220 during a later switching cycle toward a more optimal value that reduces excess base charge on the BJT 220 and thus reduces excess power dissipation by the BJT 220.

Figure 9A:
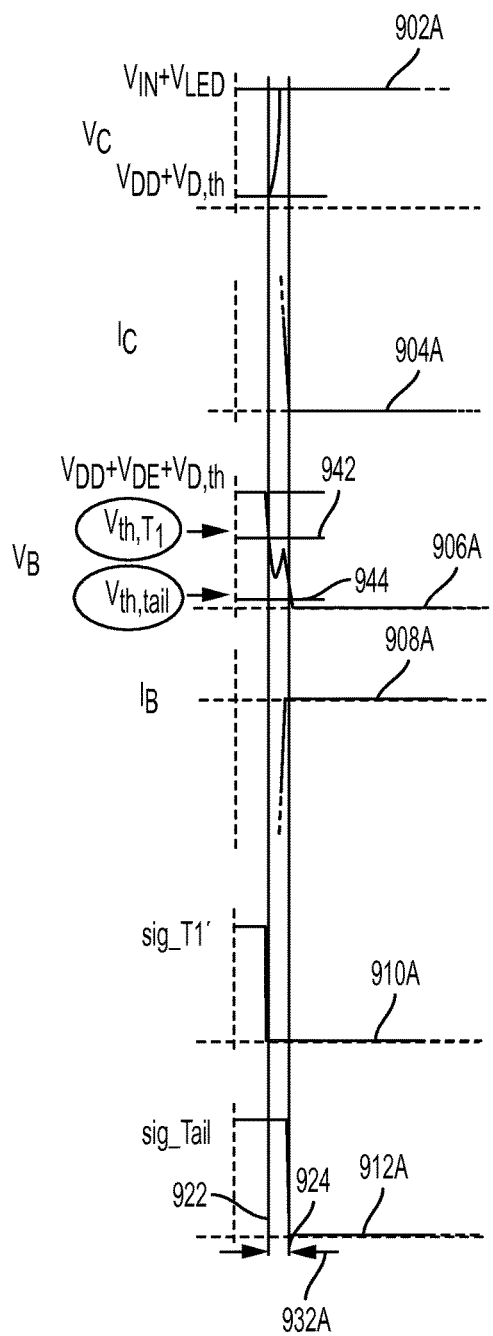
FIGS. 9A and 9B are example graphs illustrating monitoring delay time of switching off of a bipolar junction transistor (BJT) according to one embodiment of the disclosure.
Figure 9B:
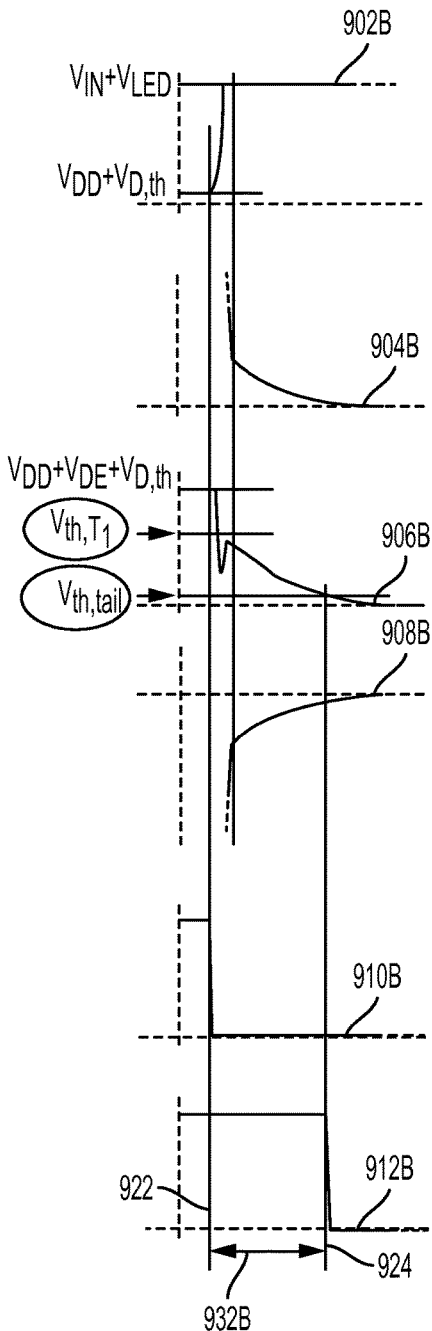

One example of operation of the circuit 800 of FIG. 8 is shown in the signal graphs of FIGS. 9A and 9B. FIGS. 9A and 9B are example graphs illustrating monitoring delay time of switching off of a bipolar junction transistor (BJT) according to one embodiment of the disclosure. Graphs 902A, 904A, 906A, 908A, 910A, and 912A illustrate collector voltage $V_C$, collector current $I_C$, base voltage $V_B$, base current $I_B$, output signal sig_T1', and output signal sig_Tail, respectively, when the BJT 220 is operated with a forward base current approximately equal to an optimal forward base current value. Graphs 902B, 904B, 906B, 908B, 910B, and 912B illustrate collector voltage $V_C$, collector current $I_C$, base voltage $V_B$, base current $I_B$, output signal sig_T1', and output signal sig_Tail, respectively, when the BJT 220 is operated with a forward base current higher than an optimal forward base current value.

For a forward base current value approximately equal to an optimal value, when the base current $I_B$ of 908A decreases below a pull down current $I_{pd}$, base voltage $V_B$ of graph 906A begins decreasing. After the base voltage $V_B$ decreases below a threshold $V_{th,T1}$, level 942, the sig_T1' output signal switches at time 922. The controller 232 may disconnect switch 824 at or after time 922 to disconnect the pull down current source 422 from the base node 226. Also at or after time 922, the controller 232 may close switch 826 to couple the resistor 828 to the base node 226. After closing switch 826, base current $I_B$ begins flowing through the resistor 828, which may cause a spike in the base voltage $V_B$ as shown in graph 906A. When the base voltage $V_B$ of graph 906A decreases below a threshold level $V_{th,tail}$ 944, the output signal sig_Tail may switch at time 924. A time period 932A and 932B from time 922 to time 924 indicates the tail current duration, which is the delay time for switching off the BJT 220 due to excess charge at the base node 226.

When the forward base current is at an approximately optimal value, the tail current duration is less than a threshold time as indicated by time period 932A of graph 912A. When the forward base current is above an approximately optimal value, the tail current duration is longer than a threshold time as indicated by the time period 932B of graph 912B. The controller 232 may implement the measurement of time period 932A and 932B in a closed-loop system as described above. For example, the method 700 of FIG. 7 illustrates at block 704 determining whether the tail current time is greater than a time corresponding to an optimal forward base current value. The controller 232 may execute block 704 by comparing the time period 932A or 932B with a threshold time value corresponding to an optimal forward base current value. Thus, the controller 232 may determine whether the BJT 220 was over-driven optimally or excessively during the switching cycle and adjust operation of the BJT 220 during future switching cycles.

Figure 10:
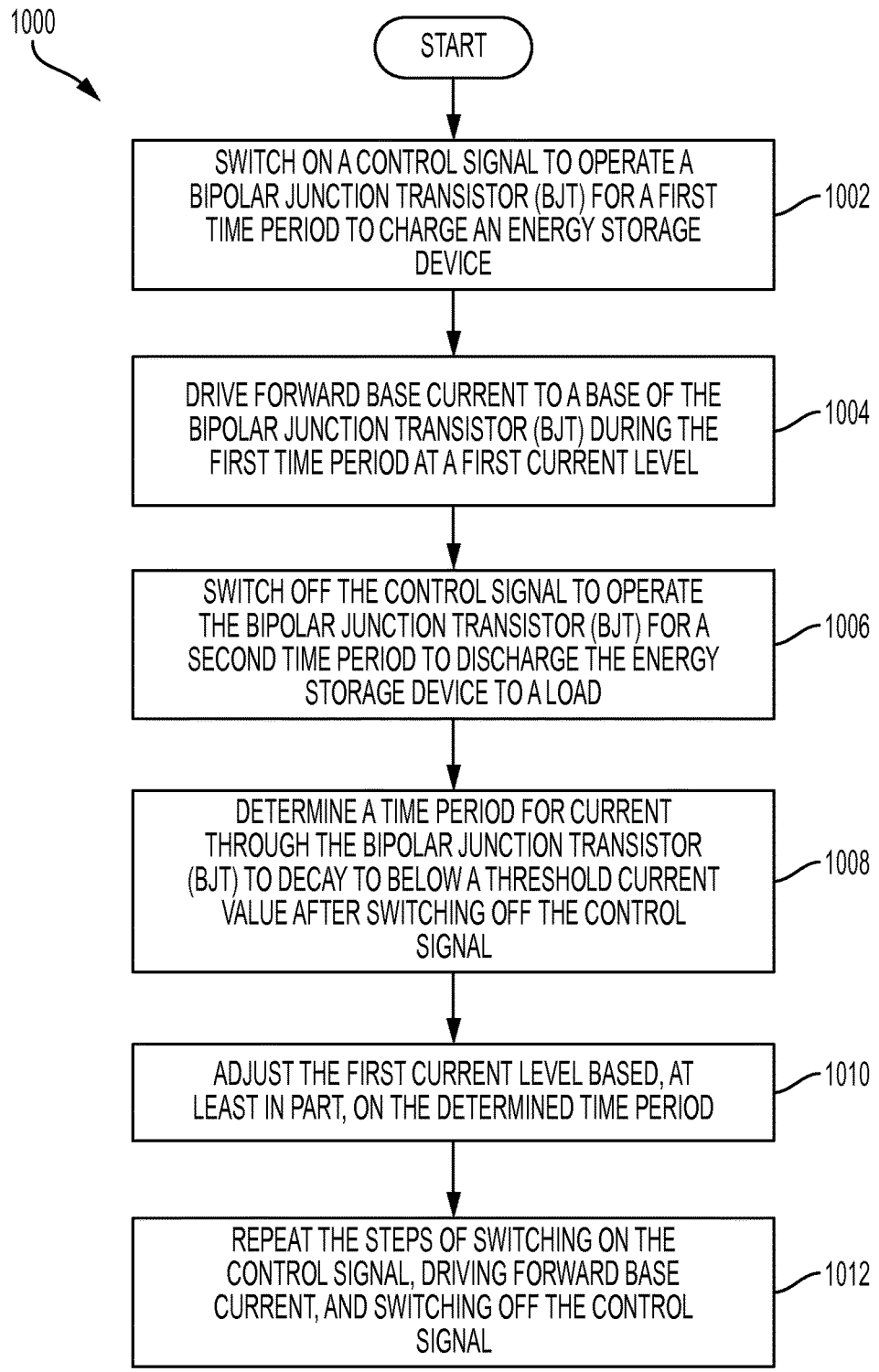
FIG. 10 is an example flow chart illustrating a method for operating a bipolar junction transistor (BJT) to operate reduce BJT turn-off delay time according to one embodiment of the disclosure.

One embodiment for operating an LED-based light bulb using the closed-loop compensation system for base current supplied to a BJT is illustrated in the flow chart of FIG. 10. FIG. 10 is an example flow chart illustrating a method for operating a bipolar junction transistor (BJT) to operate reduce BJT turn-off delay time according to one embodiment of the disclosure. A method 1000 may begin at block 1002 with switching on a control signal to operate a bipolar junction transistor (BJT) for a first time period to charge an energy storage device. For example, with reference to FIG. 4, the controller 232 may generate a control signal $V_{PLS,T1}$ to activate switch 234 into a conducting state to begin current flow through the BJT 220 to charge the inductor 212 in power stage 210.

Then, at block 1004, forward base current may be driven to a base of the bipolar junction transistor (BJT) during the first time period at a first current level. For example, the controller 232 may activate switch 324 with the control signal $V_{PLS,T1}$ and configure the forward base current source 322 to the first current level.

Next, at block 1006, the control signal may be switched off to operate the BJT for a second time period to discharge the energy storage device to a load. For example, the controller 232 may switch the control signal $V_{PLS,T1}$ to de-activate switch 234 into a non-conducting state to initiate turn off of the BJT 220. After the BJT 220 turns off, energy stored in the inductor 212 may discharge to the load 240, such as light emitting diodes (LEDs) 214.

Then, at block 1008, a time period may be determined for current through the BJT to decay to below a threshold current value, such as when the current decays to a level indicating the BJT is switched off. For example, with reference to FIG. 8, the controller 232 may monitor outputs of the comparators 830 and 834, which measure the base voltage $V_B$ of the BJT 220, to determine the decay time for the tail current through the BJT 220. The determined time period of block 1008 may be used as a basis for adjusting the first current level at block 1010. At block 1012, blocks 1002, 1004, and 1006 may be repeated using the adjusted first current level for the forward base current of block 1004.

Figure 11:
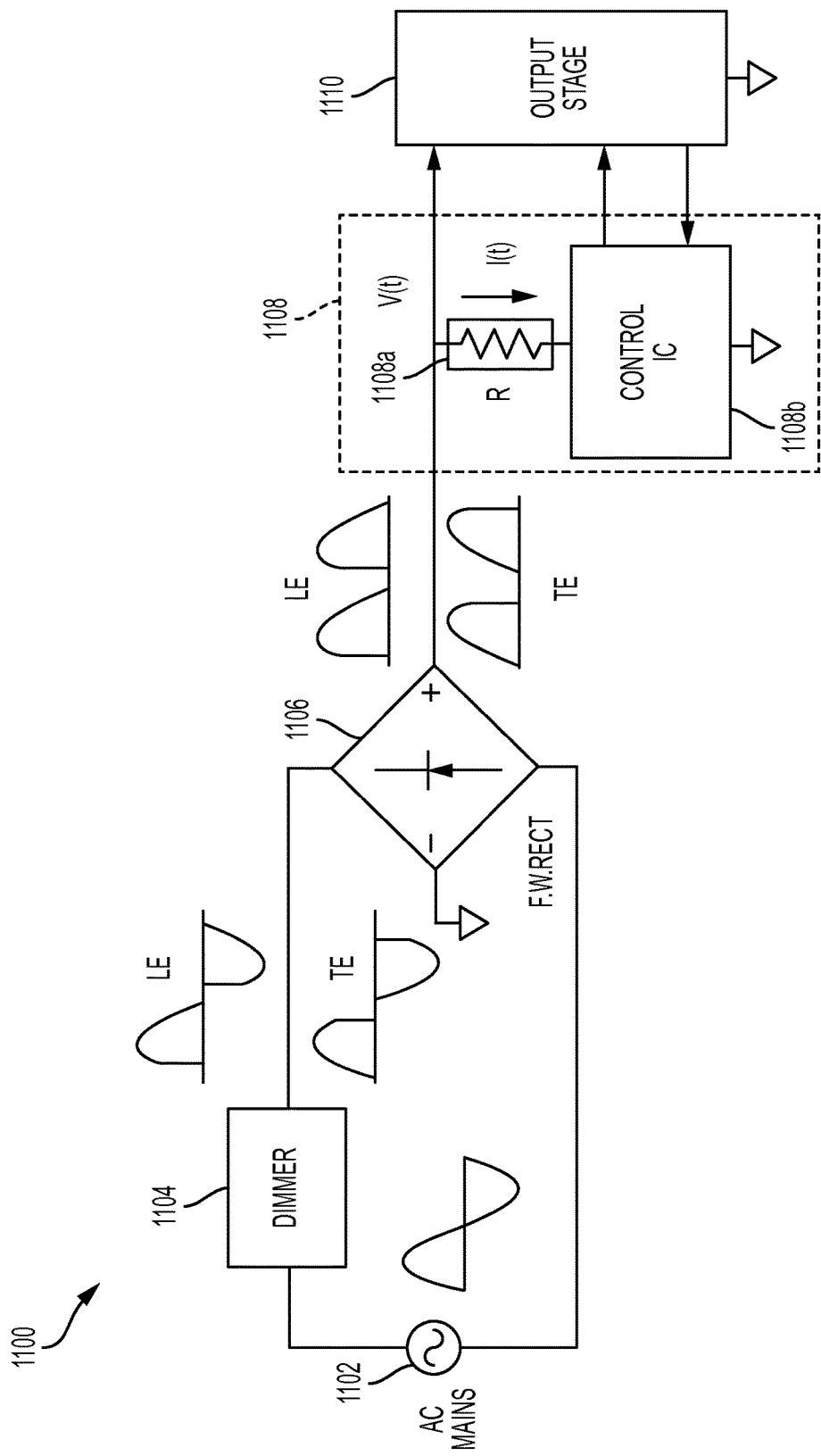
FIG. 11 is an example block diagram illustrating a dimmer system for a light-emitting diode (LED)-based bulb with two terminal drive of a bipolar junction transistor (BJT)-based power stage according to one embodiment of the disclosure.

The circuits described above, including the circuits 200, 300, 400, and/or 800 of FIGS. 2, 3, 4, and 8, respectively, described above may be integrated into a dimmer circuit to provide dimmer compatibility, such as with lighting devices. FIG. 11 is an example block diagram illustrating a dimmer system for a light-emitting diode (LED)-based bulb with two terminal drive of a bipolar junction transistor (BJT)-based power stage according to one embodiment of the disclosure. A system 1100 may include a dimmer compatibility circuit 1108 with a variable resistance device 1108a and a control integrated circuit (IC) 1108b. The dimmer compatibility circuit 1108 may couple an input stage having a dimmer 1104 and a rectifier 1106 with an output stage 1110, which may include light emitting diodes (LEDs). The system 1100 may receive input from an AC mains line 1102. The output stage 1110 may include a power stage based on a bipolar junction transistor (BJT) as described above. For example, the output stage 1110 may include an emitter-switched bipolar junction transistor (BJT) in the configurations of FIG. 2, FIG. 3, FIG. 4, or FIG. 8.

If implemented in firmware and/or software, the functions described above, such as with respect to the flow charts of FIG. 6, FIG. 7, and FIG. 10 may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically erasable programmable read-only memory (EEPROM), compact-disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. For example, although signals generated by a controller are described throughout as "high" or "low," the signals may be inverted such that "low" signals turn on a switch and "high" signals turn off a switch. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
   switching on a control signal to operate a bipolar junction transistor (BJT) for a first time period to charge an energy storage device;
   driving forward base current to a base of the bipolar junction transistor (BJT) during the first time period at a first current level;
   switching off the control signal to operate the bipolar junction transistor (BJT) for a second time period to discharge the energy storage device to a load;
   determining a time period for a current through the bipolar junction transistor (BJT) to decay to below a threshold current value after switching off the control signal by determining a time period from a first time when switching off the control signal to a second time when the current through the bipolar junction transistor (BJT) crosses the threshold current value; and
   adjusting the first current level based, at least in part, on the determined time period.

2. The method of claim 1, wherein the step of adjusting the first current level comprises, when the determined time period is above a threshold value, reducing the first current level of the forward base current.

3. The method of claim 1, further comprising coupling a reverse base current source to the base of the bipolar junction transistor (BJT) after switching off the control signal, wherein the step of determining the time period for current to decay comprises measuring a base voltage at the base of the bipolar junction transistor (BJT) while the reverse base current source is coupled to the base of the bipolar junction transistor (BJT).

4. The method of claim 3, wherein the step of determining the time period further comprises:
   comparing the measured base voltage to a first threshold voltage; and
   after the measured base voltage crosses the first threshold voltage:
      decoupling the reverse base current source from the base of the bipolar junction transistor (BJT);
      coupling a sense resistor to the base of the bipolar junction transistor (BJT); and
      measuring the base voltage at the base of the bipolar junction transistor (BJT) by measuring a voltage across the sense resistor.

5. The method of claim 4, wherein the step of determining the time period further comprises:
   comparing the measured voltage across the sense resistor with a second voltage threshold corresponding to the threshold current value; and
   after the measured voltage across the sense resistor crosses the second voltage threshold, determining the time period for current to delay as a sum of a time for the measured base voltage to cross the first threshold voltage and a time for the measured sense resistor voltage to cross the second voltage threshold.

6. The method of claim 1, wherein the step of discharging the energy storage device to the load comprises discharging the energy storage device to a plurality of light emitting diodes (LEDs).

7. The method of claim 1, further comprising repeating the steps of switching on the control signal, driving forward base current, and switching off the control signal.

8. An apparatus, comprising:
   an integrated circuit (IC) configured to couple to a bipolar junction transistor (BJT), wherein the integrated circuit (IC) comprises:
      a switch configured to couple to an emitter of the bipolar junction transistor (BJT);
      a controller coupled to the switch and configured to control delivery of power to a load by operating the switch based, at least in part, on a control signal, wherein the controller is configured to perform the steps comprising:
         switching on the control signal to operate the bipolar junction transistor (BJT) for a first time period to charge an energy storage device;
         driving forward base current to a base of the bipolar junction transistor (BJT) during the first time period at a first current level;
         switching off the control signal to operate the bipolar junction transistor (BJT) for a second time period to discharge the energy storage device to the load;
         determining a time period for current through the bipolar junction transistor (BJT) to decay to below a threshold current value after switching off the control signal by determining a time period from a first time when switching off the control signal to a second time when the current through the bipolar junction transistor (BJT) crosses the threshold current value; and
         adjusting the first current level based, at least in part, on the determined time period.

9. The apparatus of claim 8, wherein the step of adjusting the first current level comprises, when the determined time period is above a threshold value, reducing the first current level of the forward base current.

10. The apparatus of claim 8, wherein the integrated circuit (IC) further comprises:
   a first switch coupled to the base of the bipolar junction transistor;
   a reverse base current source coupled to the first switch; and a first sense amplifier coupled to the switch and to a first reference voltage input node configured to receive a first reference voltage, and wherein the controller is configured to determine the time period by performing the steps comprising:
activating the first switch to couple the reverse base current source to the base of the bipolar junction transistor (BJT) after switching off the control signal; and
measuring, with the first sense amplifier, a base voltage at the base of the bipolar junction transistor (BJT) while the reverse base current source is coupled to the base of the bipolar junction transistor (BJT).

11. The apparatus of claim 10, wherein the controller is further configured to perform the steps comprising:
comparing the measured base voltage to the first reference voltage; and
after the measured base voltage crosses the first reference voltage, deactivating the first switch to decouple the reverse base current source from the base of the bipolar junction transistor (BJT).

12. The apparatus of claim 11, further comprising:
a resistor;
a second switch coupled to the base of the bipolar junction transistor (BJT); and
a second comparator coupled to the resistor and a second reference voltage input node configured to receive a second reference voltage,
wherein the controller is configured to determine the time period by performing the steps comprising:
activating the second switch to couple the resistor to the base of the bipolar junction transistor (BJT) after de-activating the first switch;
measuring, with the second sense amplifier, the base voltage at the base of the bipolar junction transistor (BJT).

13. The apparatus of claim 12, wherein the controller is configured to determine the time period by performing the steps comprising:
comparing the measured base voltage across the sense resistor with the second reference voltage; and
after the measured base voltage crosses the second reference voltage, determining the time period for current to delay as a sum of a time for the measured base voltage to cross the first reference voltage and a time for the measured base voltage to cross the second reference voltage.

14. The apparatus of claim 8, wherein the step of discharging the energy storage device to the load comprises discharging the energy storage device to a plurality of light emitting diodes (LEDs).

15. The apparatus of claim 8, wherein the controller is further configured to perform the step comprising repeating the steps of switching on the control signal, driving forward base current, and switching off the control signal.

16. An apparatus, comprising:
a lighting load comprising a plurality of light emitting diodes (LEDs);
a bipolar junction transistor (BJT) comprising a base, an emitter, and a collector, wherein the collector of the bipolar junction transistor (BJT) is coupled to an input node; and
an integrated circuit (IC) configured to couple to a bipolar junction transistor (BJT), wherein the integrated circuit (IC) comprises:
a switch configured to couple to an emitter of the bipolar junction transistor (BJT);
a controller coupled to the switch and configured to control delivery of power to a load by operating the switch based, at least in part, on a generated control signal, wherein the controller is configured to perform the steps comprising:
switching on the control signal to operate the bipolar junction transistor (BJT) for a first time period to charge an energy storage device;
driving forward base current to a base of the bipolar junction transistor (BJT) during the first time period at a first current level;
switching off the control signal to operate the bipolar junction transistor (BJT) for a second time period to discharge the energy storage device to the load;
determining a time period for current through the bipolar junction transistor (BJT) to decay to below a threshold current level after switching off the control signal by determining a time period from a first time when switching off the control signal to a second time when the current through the bipolar junction transistor (BJT) crosses the threshold current value; and
adjusting the first current level based, at least in part, on the determined time period.

17. The apparatus of claim 16, wherein the integrated circuit (IC) further comprises:
a first switch coupled to the base of the bipolar junction transistor;
a reverse base current source coupled to the first switch; and
a first sense amplifier coupled to the switch and to a first reference voltage, and
wherein the controller is configured to determine the time period by performing the steps comprising:
activating the first switch to couple the reverse base current source to the base of the bipolar junction transistor (BJT) after switching off the control signal; and
measuring, with the first sense amplifier, a base voltage at the base of the bipolar junction transistor (BJT) while the reverse base current source is coupled to the base of the bipolar junction transistor (BJT).

18. The apparatus of claim 17, wherein the controller is further configured to perform the steps comprising:
comparing the measured base voltage to the first reference voltage; and
after the measured base voltage crosses the first threshold voltage, deactivating the first switch to decouple the reverse base current source from the base of the bipolar junction transistor (BJT).

19. The apparatus of claim 18, wherein the integrated circuit (IC) further comprises:
a resistor;
a second switch coupled to the base of the bipolar junction transistor (BJT); and
a second comparator coupled to the resistor and a second reference voltage input node configured to receive a second reference voltage,
wherein the controller is configured to determine the time period by performing the steps comprising:
activating the second switch to couple the resistor to the base of the bipolar junction transistor (BJT) after de-activating the first switch;
measuring, with the second sense amplifier, the base voltage at the base of the bipolar junction transistor (BJT).

20. The apparatus of claim 19, wherein the controller is configured to determine the time period by performing the steps comprising:
    comparing the measured base voltage across the resistor with the second reference voltage; and
    after the measured base voltage crosses the second reference voltage, determining the time period for current to delay as a sum of a time for the measured base voltage to cross the first reference voltage and a time for the measured base voltage to cross the second reference voltage.

\* \* \* \* \*